(12) United States Patent
Michaud et al.

(10) Patent No.: US 10,049,046 B1
(45) Date of Patent: Aug. 14, 2018

(54) METHODS AND APPARATUS FOR MEMORY TIER PAGE CACHE WITH ZERO FILE

(71) Applicant: EMC Corporation, Hopkinton, MA (US)

(72) Inventors: Adrian Michaud, Carlisle, MA (US); Roy E. Clark, Hopkinton, MA (US); Kenneth J. Taylor, Franklin, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 14/501,112

(22) Filed: Sep. 30, 2014

Related U.S. Application Data

(60) Provisional application No. 62/004,163, filed on May 28, 2014.

(51) Int. Cl.
| | | |
|---|---|---|
| *G06F 12/08* | (2016.01) | |
| *G06F 12/02* | (2006.01) | |
| *G11C 7/10* | (2006.01) | |
| *G06F 12/0868* | (2016.01) | |
| *G06F 12/0831* | (2016.01) | |

(52) U.S. Cl.
CPC ...... *G06F 12/0868* (2013.01); *G06F 12/0246* (2013.01); *G06F 12/0835* (2013.01); *G11C 7/1072* (2013.01); *G06F 2212/6046* (2013.01); *G06F 2212/621* (2013.01); *G06F 2212/7201* (2013.01)

(58) Field of Classification Search
CPC ............. G06F 12/0871; G06F 12/0897; G06F 12/0868; G06F 12/0246; G06F 12/0835; G06F 2212/6046; G06F 2212/621; G06F 2212/7201
See application file for complete search history.

(56) References Cited

U.S. PATENT DOCUMENTS

| | | | |
|---|---|---|---|
| 4,429,363 | A | 1/1984 | Duke et al. |
| 5,276,867 | A | 1/1994 | Kenley et al. |
| 5,386,547 | A | 1/1995 | Jouppi |
| 5,440,686 | A | 8/1995 | Dahman et al. |
| 5,564,035 | A | 10/1996 | Lai |
| 5,664,153 | A | 9/1997 | Farrell |
| 5,809,560 | A | 9/1998 | Schneider |
| 6,115,790 | A | 9/2000 | Schimmel |
| 6,185,575 | B1 | 2/2001 | Orcutt |
| 6,205,528 | B1 * | 3/2001 | Kingsbury .......... G06F 12/1072 711/153 |
| 6,487,562 | B1 | 11/2002 | Mason, Jr. et al. |

(Continued)

OTHER PUBLICATIONS

Office Action dated Dec. 11, 2015 for U.S. Appl. No. 14/319,440; 34 Pages.

(Continued)

*Primary Examiner* — Ann J Lo
*Assistant Examiner* — Masud Khan
(74) *Attorney, Agent, or Firm* — Daly, Crowley, Mofford & Durkee, LLP

(57) ABSTRACT

Methods and apparatus for providing region zero-fill on demand for tiered memory including a first region in a first memory tier having a page cache in physical memory, where virtual memory includes a mmap of the first region. An input can be controlled between zeroes and the first region to the page cache.

15 Claims, 15 Drawing Sheets

(56) References Cited

U.S. PATENT DOCUMENTS

| | | | |
|---|---|---|---|
| 6,618,793 | B2 | 9/2003 | Rozario et al. |
| 6,629,200 | B1 | 9/2003 | Kanamaru et al. |
| 6,633,954 | B1 | 10/2003 | Don et al. |
| 6,678,793 | B1 | 1/2004 | Doyle |
| 6,715,037 | B2 | 3/2004 | Malcolm |
| 6,728,837 | B2 | 4/2004 | Wilkes et al. |
| 6,732,242 | B2 | 5/2004 | Hill et al. |
| 6,748,494 | B1 | 6/2004 | Yashiro |
| 6,795,894 | B1 | 9/2004 | Neufeld et al. |
| 6,829,698 | B2 | 12/2004 | Arimilli et al. |
| 6,829,762 | B2 | 12/2004 | Arimilli et al. |
| 6,842,847 | B2 | 1/2005 | Arimilli et al. |
| 6,851,024 | B1 | 2/2005 | Wilkes et al. |
| 6,920,514 | B2 | 7/2005 | Arimilli et al. |
| 6,925,551 | B2 | 8/2005 | Arimilli et al. |
| 7,017,031 | B2 | 3/2006 | Arimilli et al. |
| 7,213,005 | B2 | 5/2007 | Mourad et al. |
| 7,213,248 | B2 | 5/2007 | Arimilli et al. |
| 7,644,239 | B2 | 1/2010 | Ergan et al. |
| 7,856,530 | B1 | 12/2010 | Mu |
| 8,438,339 | B2 | 5/2013 | Krishna et al. |
| 8,914,579 | B2 | 12/2014 | Maeda et al. |
| 9,021,048 | B2 | 4/2015 | Luna et al. |
| 9,043,530 | B1 | 5/2015 | Sundaram et al. |
| 9,092,156 | B1 | 7/2015 | Xu et al. |
| 2002/0010836 | A1 | 1/2002 | Barroso et al. |
| 2002/0038391 | A1 | 3/2002 | Ido et al. |
| 2003/0101320 | A1* | 5/2003 | Chauvel ............ G06F 12/0888 711/154 |
| 2005/0091457 | A1 | 4/2005 | Auld et al. |
| 2005/0097272 | A1 | 5/2005 | Jiang et al. |
| 2005/0172098 | A1* | 8/2005 | Worley ............ G06F 12/1036 711/206 |
| 2006/0010169 | A1 | 1/2006 | Kitamura |
| 2006/0026372 | A1 | 2/2006 | Kim et al. |
| 2006/0218349 | A1 | 9/2006 | Oe et al. |
| 2007/0011420 | A1 | 1/2007 | Boss et al. |
| 2008/0256294 | A1 | 10/2008 | Gill |
| 2010/0325352 | A1 | 12/2010 | Schuette et al. |
| 2011/0099335 | A1 | 4/2011 | Scott et al. |
| 2011/0125977 | A1 | 5/2011 | Karr et al. |
| 2011/0161589 | A1 | 6/2011 | Guthrie et al. |
| 2012/0079318 | A1 | 3/2012 | Colgrove et al. |
| 2012/0089803 | A1 | 4/2012 | Dice |
| 2012/0137055 | A1 | 5/2012 | Lee et al. |
| 2012/0239871 | A1 | 9/2012 | Badam et al. |
| 2012/0297113 | A1 | 11/2012 | Belluomini et al. |
| 2012/0317312 | A1 | 12/2012 | Elko et al. |
| 2013/0246767 | A1 | 9/2013 | Bradbury et al. |
| 2013/0254462 | A1 | 9/2013 | Whyte |
| 2013/0332660 | A1 | 12/2013 | Talagala et al. |
| 2014/0013053 | A1 | 1/2014 | Sawin et al. |
| 2014/0019650 | A1* | 1/2014 | Li ............................ G06F 5/06 710/53 |
| 2014/0082288 | A1 | 3/2014 | Beard et al. |
| 2014/0101370 | A1 | 4/2014 | Chu et al. |
| 2014/0108764 | A1 | 4/2014 | Li et al. |
| 2014/0115256 | A1* | 4/2014 | Liu ................. G06F 12/0866 711/122 |
| 2014/0129779 | A1 | 5/2014 | Frachtenberg et al. |
| 2014/0156935 | A1 | 6/2014 | Raikin et al. |
| 2014/0201302 | A1 | 7/2014 | Dube et al. |
| 2014/0223072 | A1 | 8/2014 | Shivashankaraiah et al. |
| 2014/0244960 | A1 | 8/2014 | Ise et al. |
| 2014/0289739 | A1 | 9/2014 | Bodzsar et al. |
| 2014/0298317 | A1 | 10/2014 | Devine |
| 2015/0026403 | A1 | 1/2015 | Ish et al. |
| 2015/0046636 | A1 | 2/2015 | Seo et al. |
| 2015/0178097 | A1* | 6/2015 | Russinovich ......... G06F 9/4418 713/2 |
| 2015/0301931 | A1 | 10/2015 | Ahmad et al. |
| 2015/0324294 | A1* | 11/2015 | Ogawa ............... G06F 12/0871 711/118 |
| 2015/0378953 | A1 | 12/2015 | Debbage et al. |

OTHER PUBLICATIONS

EMC Corporation, "EMC VSPEX with EMC XtremSF and EMC XtremSW Cache;" Design Guide; May 2013; 84 Pages.
"Pointer Basics;" Retrieved on Dec. 17, 2015 from Stanford CS Education Library; https://web.archive.org/web/20120214194251/http://cslibrary.stanford.edu/106; 5 Pages.
"Logical Unit No. (LUN);" Definition from Techopedia.com; Retrieved on Dec. 17, 2015; https://web.archive.org/web/20120113025245/http://www.techopedia.com/definition/321/logical-unit-number-lun; 2 Pages.
Cooney et al., "Prioritization for Cache Systems;" U.S. Appl. No. 14/319,440, filed Jun. 30, 2014; 23 Pages.
Michaud, "Methods and Apparatus for Direct Cache-Line Access to Attached Storage with Cache;" U.S. Appl. No. 14/318,939, filed Jun. 30, 2014; 16 Pages.
Clark et al., "Second Caches for Memory and Page Caches;" U.S. Appl. No. 14/564,420, filed Dec. 9, 2014; 21 Pages.
EMC Corporation, "Introduction to EMC Xtremcache;" White Paper; Nov. 2013; 33 Pages.
EMC Corporation, "EMC VSPEX with EMC XTREMSF and EMC Xtremcache;" Design Guide; Dec. 2013; 95 Pages.
Response to Jan. 21, 2016 Office Action for U.S. Appl. No. 14/318,939, filed Apr. 14, 2016; 7 pages.
U.S. Office Action dated Feb. 25, 2016 corresponding to U.S. Appl. No. 14/314,366; 15 Pages.
U.S. Appl. No. 14/501,096, filed Sep. 30, 2014, Michaud et al.
U.S. Appl. No. 14/501,104, filed Sep. 30, 2014, Michaud et al.
Tam et al., "mlcache: A Flexible Multi-Lateral Cache Simulator;" Proceedings of the 6th International Symposium on Modeling, Analysis and Simulation of Computer and Telecommunication Systems; Jul. 19-24, 1998; pp. 19-26; 8 Pages.
Response to U.S. Office Action dated Dec. 11, 2015 corresponding to U.S. Appl. No. 14/319,440; Response filed on Feb. 26, 2016; 33 Pages.
U.S. Final Office Action dated Jun. 3, 2016 corresponding to U.S. Appl. No. 14/319,440; 46 Pages.
Response to U.S. Office Action dated Feb. 25, 2016 corresponding to U.S. Appl. No. 14/314,366; Response filed on May 25, 2016; 13 Pages.
U.S. Office Action dated Feb. 4, 2016 corresponding to U.S. Appl. No. 14/501,096; 19 Pages.
Response to U.S. Office Action dated Feb. 4, 2016 corresponding to U.S. Appl. No. 14/501,096; Response filed on Jun. 2, 2016; 10 Pages.
U.S. Office Action dated Jan. 5, 2016 corresponding to U.S. Appl. No. 14/501,104; 23 Pages.
Response to U.S. Office Action dated Jan. 5, 2016 corresponding to U.S. Appl. No. 14/501,104; Response filed on Jun. 2, 2016; 12 Pages.
U.S. Appl. No. 14/318,939 Office Action dated Jan. 21, 2016, 9 pages.
U.S. Non-Final Office Action dated Feb. 27, 2017 for U.S. Appl. No. 14/501,096; 24 Pages.
U.S. Appl. No. 14/314,366 Notice of Allowance dated Jul. 1, 2016, 16 pages.
U.S. Appl. No. 14/501,104 Final Office Action dated Jul. 29, 2016, 27 pages.
U.S. Office Action dated Aug. 3, 2016 corresponding to U.S. Appl. No. 14/564,420; 31 Pages.
U.S. Appl. No. 15/270,360, filed Sep. 20, 2016, Michaud et al.
Response to Final Office Action dated Jun. 3, 2016 corresponding to U.S. Appl. No. 14/319,440; Response filed Sep. 22, 2016; 18 Pages.
Advisory Action dated Sep. 30, 2016 corresponding to U.S. Appl. No. 14/319,440; 3 Pages.
Response to Final Office Action dated Jul. 14, 2016 corresponding to U.S. Appl. No. 14/318,939; Response filed on Oct. 5, 2016; 7 Pages.
Advisory Action dated Oct. 13, 2016 corresponding to U.S. Appl. No. 14/318,939; 3 Pages.

(56) References Cited

OTHER PUBLICATIONS

Supplemental Response to Final Office Action dated Jul. 14, 2016 corresponding to U.S. Appl. No. 14/318,939; Response filed on Oct. 14, 2016; 7 Pages.
U.S. Notice of Allowance dated Nov. 10, 2016 for U.S. Appl. No. 14/319,440; 21 Pages.
Response to Office Action dated Aug. 3, 2016 for U.S. Appl. No. 14/564,420; Response filed on Nov. 3, 2016; 16 Pages.
Response to Final Office Action dated Jul. 14, 2016 for U.S. Appl. No. 14/318,939; Response filed on Nov. 9, 2016; 8 Pages.
Advisory Action dated Nov. 8, 2016 for U.S. Appl. No. 14/318,939; 3 Pages.
Request for Continued Examination (RCE) and Response to Final Office Action dated Jul. 8, 2016 for U.S. Appl. No. 14/501,096; RCE and Response filed on Nov. 1, 2016; 15 Pages.
Appeal Brief filed on Dec. 27, 2016; for U.S. Appl. No. 14/501,104; 18 pages.
U.S. Appl. No. 14/501,096 Final Office Action dated Jul. 8, 2016, 24 pages.
U.S. Appl. No. 14/318,939 Final Office Action dated Jul. 14, 2016, 11 pages.
U.S. Final Office Action dated Feb. 10, 2017 for U.S. Appl. No. 14/564,420; 29 Pages.
Examiner's Answer dated May 16, 2017 to Appeal Brief filed on Dec. 27, 2017 for U.S. Appl. No. 14/501,104; 7 Pages.
Request for Continued Examination filed Jun. 12, 2017 for U.S. Appl. No. 14/564,420; 3 pages.
Request for Extension of Time filed Jun. 12, 2017 for U.S. Appl. No. 14/564,420; 1 page.
Amendment filed Jun. 12, 2017 for U.S. Appl. No. 14/564,420; 27 pages.
Response to U.S. Non-Final Office Action dated Feb. 27, 2017 for U.S. Appl. No. 14/501,096; Response filed on Jun. 27, 2017; 13 Pages.
Notice of Allowance dated Mar. 23, 2017 for U.S. Appl. No. 14/318,939; 11 Pages.
Office Action dated Jul. 28, 2017 for U.S. Appl. No. 14/564,420; 24 pages.
Office Action dated Sep. 1, 2017 from U.S. Appl. No. 15/270,360; 30 Pages.
Response to Office Action filed on Oct. 26, 2017 for U.S. Appl. No. 14/564,420; 18 pages.
Replacement Drawings filed on Oct. 26, 2017 for U.S. Appl. No. 14/564,420; 6 pages.
Applicant Initiated Interview Summary dated Nov. 1, 2017 for U.S. Appl. No, 14/564,420; 3 pages.
Notice of Appeal Filed Oct. 19, 2017 for U.S. Appl. No. 14/501,096; 2 pages.
Response to U.S. Office Action dated Sep. 1, 2017 corresponding to U.S. Appl. No. 15/270,360; Response filed Dec. 1, 2017; 9 Pages.
Appeal Brief filed Jan. 12, 2018 corresponding to U.S. Appl. No. 14/501,096; 19 Pages.
U.S. Final Office Action dated Jan. 23, 2018 for U.S. Appl. No. 15/270,360; 20 Pages.
U.S. Final Office Action dated Feb. 8, 2018 for U.S. Appl. No. 14/564,420; 22 Pages.
U.S. Final Office Action dated Aug. 1, 2017 for U.S. Appl. No. 14/501,096; 24 Pages.
Reply Brief to Examiner's Answer dated May 16, 2017 for U.S. Appl. No. 14/501,104; Reply Filed on Jul. 14, 2017; 10 Pages.
U.S. Non-Final Office Action dated Jul. 28, 2017 for U.S. Appl. No. 14/564,420; 26 Pages.
Response to Final Office Action dated Jan. 23, 2018 for U.S. Appl. No. 15/270,360; Response filed Apr. 23, 2018; 9 Pages.
Examiners Answer to Appeal Brief dated Apr. 19, 2018 for U.S. Appl. No. 14/501,096; 9 Pages.

* cited by examiner

METHODS AND APPARATUS FOR MEMORY TIER PAGE CACHE WITH ZERO FILE

CROSS REFERENCE TO RELATED APPLICATIONS

This application claims the benefit of U.S. Patent Application No. 62/004,163, filed on May 28, 2014, which is incorporated herein by reference.

BACKGROUND

A data storage system environment typically includes one or more host computing devices ("hosts") in communication with one or more storage arrays. A host typically executes an application program (e.g., a database application) which requires data associated with the application to be stored locally (i.e., on the host), remotely (i.e., on one of the storage arrays), or stored both locally and remotely. The host typically includes memory devices that provide both volatile random access memory capacity (e.g., Dynamic RAM or DRAM devices) and non-volatile random access memory capacity (e.g., flash memory devices). The storage array typically includes storage devices that provide non-volatile random access storage capacity (e.g., flash memory devices) and non-volatile large storage capacity (e.g., hard disk drives (HDDs) and tape drives). In general, random access memory is used to satisfy high throughput and/or bandwidth requirements of a given application program while the hard disk and tape drives are used to satisfy capacity requirements.

In a data storage environment, the ability to define multiple, independent memory tiers is desirable. A memory tier is typically constructed by memory mapping a region of a storage class memory (SCM) device (e.g., a flash memory) or a region of an array storage device into the process's virtual memory address space. The memory-mapped regions may be fronted by a DRAM page cache to which the application issues loads and stores. Memory tiering applications move data between the SCM (or array device) and the DRAM page cache on an on-demand page basis.

SUMMARY

In one aspect of the invention, a method comprises: providing region zero-fill on demand for tiered memory including a first region in a first memory tier having a page cache in physical memory, where virtual memory includes a mmap of the first region; and controlling an input between zeroes and the first region to the page cache.

The method can further include one or more of the following features: controlling a multiplexer having an output coupled to the page cache and input coupled to the first region and a zero fill module, controlling a per region attribute to selectively suppress data transfer from the storage to the page cache, the physical memory comprises SCM storage, and/or the page cache comprises DRAM memory.

In another aspect of the invention, an article comprises: a non-volatile computer-readable storage medium having stored instructions that enable a machine to: provide region zero-fill on demand for tiered memory including a first region in a first memory tier having a page cache in physical memory, where virtual memory includes a mmap of the first region; and control an input between zeroes and the first region to the page cache.

The article can further include one or more of the following features: controlling a multiplexer having an output coupled to the page cache and input coupled to the first region and a zero fill module, controlling a per region attribute to selectively suppress data transfer from the storage to the page cache, the physical memory comprises SCM storage, and/or the page cache comprises DRAM memory.

In a further aspect of the invention, a system comprises: a memory; and a processor coupled to the memory, the processor the memory configured to: provide region zero-fill on demand for tiered memory including a first region in a first memory tier having a page cache in physical memory, where virtual memory includes a mmap of the first region; and control an input between zeroes and the first region to the page cache.

The system can be further configured to include one or more of the following features: controlling a multiplexer having an output coupled to the page cache and input coupled to the first region and a zero fill module, controlling a per region attribute to selectively suppress data transfer from the storage to the page cache, the physical memory comprises SCM storage, and/or the page cache comprises DRAM memory.

BRIEF DESCRIPTION OF THE DRAWINGS

The foregoing features of this invention, as well as the invention itself, may be more fully understood from the following description of the drawings in which.

DETAILED DESCRIPTION

Figure 1:
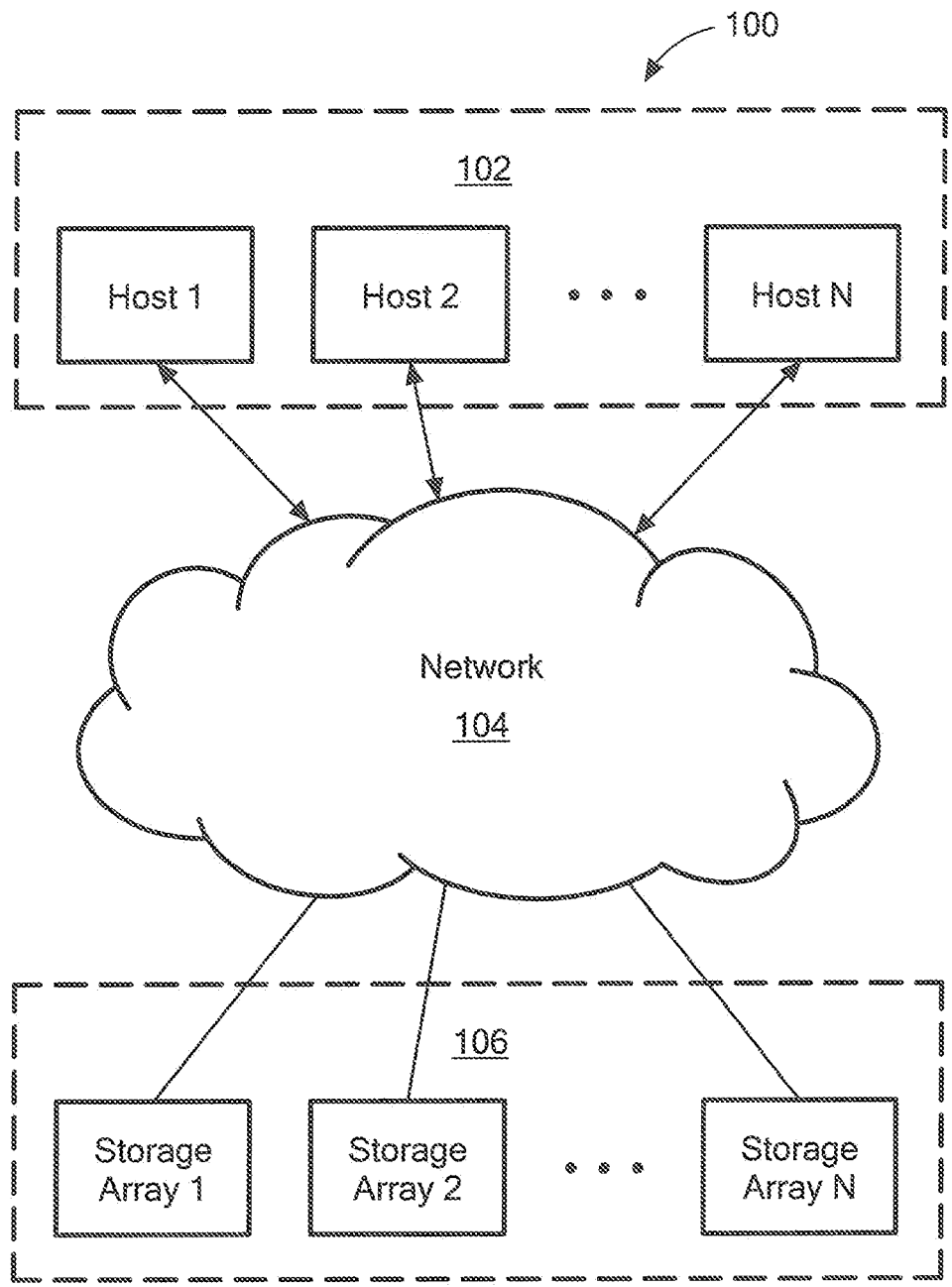
FIG. 1 is a network diagram illustrating a data memory and storage system environment.

Embodiments of the present invention will be described herein with reference to illustrative computing systems, data memory and storage systems, and associated servers, computers, memory devices, storage devices and other processing devices. It is to be appreciated, however, that embodiments of the invention are not restricted to use with the particular illustrative system and device configurations shown.

Before describing embodiments of the concepts, structures, and techniques sought to be protected herein, some terms are explained. The phrases "computer," "computing system," "computing environment," "processing platform," "data memory and storage system," and "data memory and storage system environment" as used herein with respect to various embodiments are intended to be broadly construed, so as to encompass, for example, private or public cloud computing or storage systems, or parts thereof, as well as other types of systems comprising distributed virtual infrastructure and those not comprising virtual infrastructure.

The terms "application," "program," "application program," and "computer application program" herein refer to any type of software application, including desktop applications, server applications, database applications, and mobile applications. The terms "application process" and "process" refer to an instance of an application that is being executed within a computing environment. As used herein, the term "object" refers to a logic grouping of data within an application, including primitive data types (e.g. integers and characters), arrays, trees, structures, unions, hashes, etc. The term "object reference" herein refers to any type of reference to an object, such as a pointer.

The term "source code" refers to computer instructions in a high-level programming language, such as C, C++, JAVA, Ruby, Python, etc. The term "machine code" refers to: (1) a set of instructions executed directly by a computer's processor or a virtual machine processor; and (2) such instructions expressed in the assembly language. The term "compiler directive" is used herein to refer to reserved syntax which controls the operation of a compiler and which is separate from normal computer instructions. Non-limiting examples of compiler directives include pre-processor directives and storage classes.

The term "memory" herein refers to any type of computer memory accessed by an application using memory access programming semantics, including, by way of example, dynamic random access memory (DRAM) and memory-mapped files. Typically, reads or writes to underlying devices is done by an operating system (OS), not the application. As used herein, the term "storage" refers to any resource that is accessed by the application via input/output (I/O) device semantics such as read and write systems calls. In certain instances, the same physical hardware device could be accessed by the application as either memory or as storage.

As used herein, the term "tiering" refers to the placement of information on an infrastructure resource commensurate with implementation of a defined policy. Such policies can take factors into account a variety of factors including, but not limited to: information utilization usage statistics (e.g., I/O reads, writes, memory access); customer information values associated with levels of service (e.g., gold, silver, bronze, production, test, sandbox, archive); and any other custom tiering stratification criteria.

FIG. 1 shows an illustrative data memory and storage system environment 100 comprising a plurality of application host computing devices ("application hosts") 102 operatively coupled to one or more storage arrays 106 via a network 104. The network 104 may be any known communication network or combination of networks including networks using protocols such as, but not limited to, Ethernet, Internet Small Computer System Interface (iSCSI), Fibre Channel (FC), wireless protocols, etc.

The application hosts 102 are configured to execute applications, such as database applications. An application host 102 is typically a server (e.g., a Windows server, a Sun Solaris server, an HP server, a Linux server, etc.) upon which the application executes. A storage array 106, which may be a storage area network (SAN) array, comprises one or more storage products such as, by way of example, VNX and Symmetrix VMAX, both commercially available from EMC Corporation of Hopkinton, Mass. A variety of other storage products may be utilized to implement at least a portion of a storage array.

In general operation, an application host executes the application using local memory resources and issues read and write requests ("commands") to a storage array 106. The storage array 106 is configured with storage resources used to store backend data files. The storage array 106 processes read and write commands received from the application host and, in the case of a read request, sends data stored thereon back to the requesting host.

In one aspect, the illustrative environment 100 provides a memory and storage tier architecture (or "structure"). The tier structure comprises one or more tiers resident on an application host 102 and one or more tiers resident on a storage array 106. As discussed further below, applications residing on the application hosts 102 determine (either automatically or in response to user input) on which of the various tiers to store data associated with the execution of an application.

Figure 2:
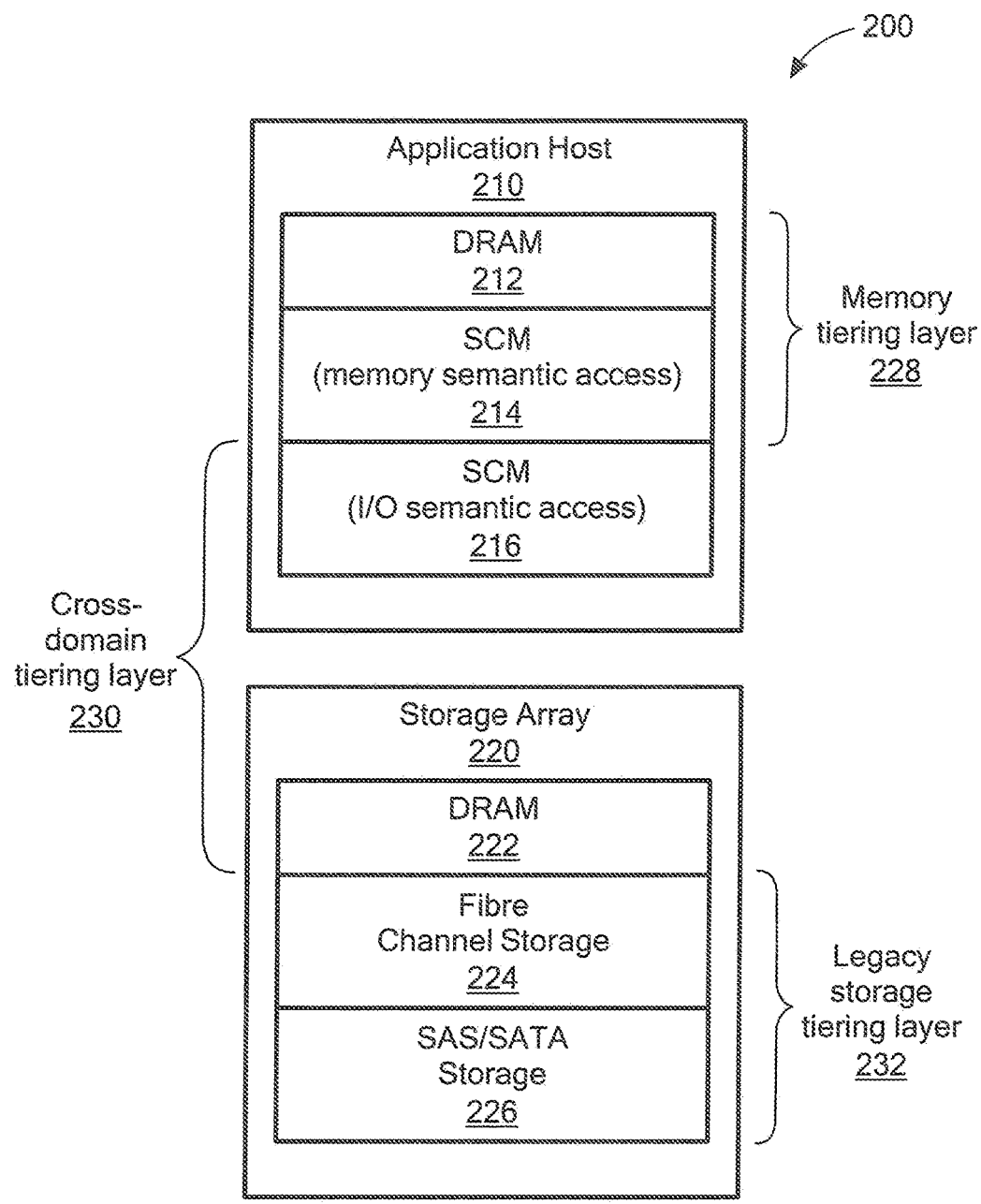
FIG. 2 is a block diagram illustrating a memory and storage tiering structure.

FIG. 2 shows an illustrative memory and storage tier structure 200. The illustrative tier structure 200 spans an application host 210 and a storage array 220, which may be the same as or similar to an application host 102 and a storage array 106 of FIG. 1, respectively. As shown, tiers resident on the application host 210 include a dynamic random access memory tier 212 (e.g., DRAM or other form of volatile random access memory), an SCM tier 214 accessible as a memory resource, and an SCM tier 216 accessible as an I/O resource. As further shown, tiers resident on the storage array 220 include an SCM tier 222 accessible as an I/O resource, a network (e.g., Fibre Channel) storage tier 224, and serial attached storage (SAS/SATA) tier 226.

The SCM 214 tier comprises one or more SCM devices. Non-limiting examples of SCM devices include NAND flash, solid state drives (SSDs), next generation non-volatile memory (NVM) drives/cards/dual in-line memory modules (DIMMs), NAND RAM, phase change memory (PCM) RAM, and spin torque (ST) RAM. In embodiments, an SCM device is connected via a PCI-E bus.

In one aspect, the tier structure 200 provides a memory tiering layer 228 (via memory tiers 212 and 214), a cross-domain tiering layer 230 (via SCM I/O accessible tiers 216 and 222), and a legacy storage tiering layer 232 (via storage tiers 224 and 226). Thus, an application can make data placement selections end-to-end (i.e., across the memory tiering layer, the cross-domain tiering layer, and the legacy storage tiering layer) or within a single within a tiering layer.

Figure 3:
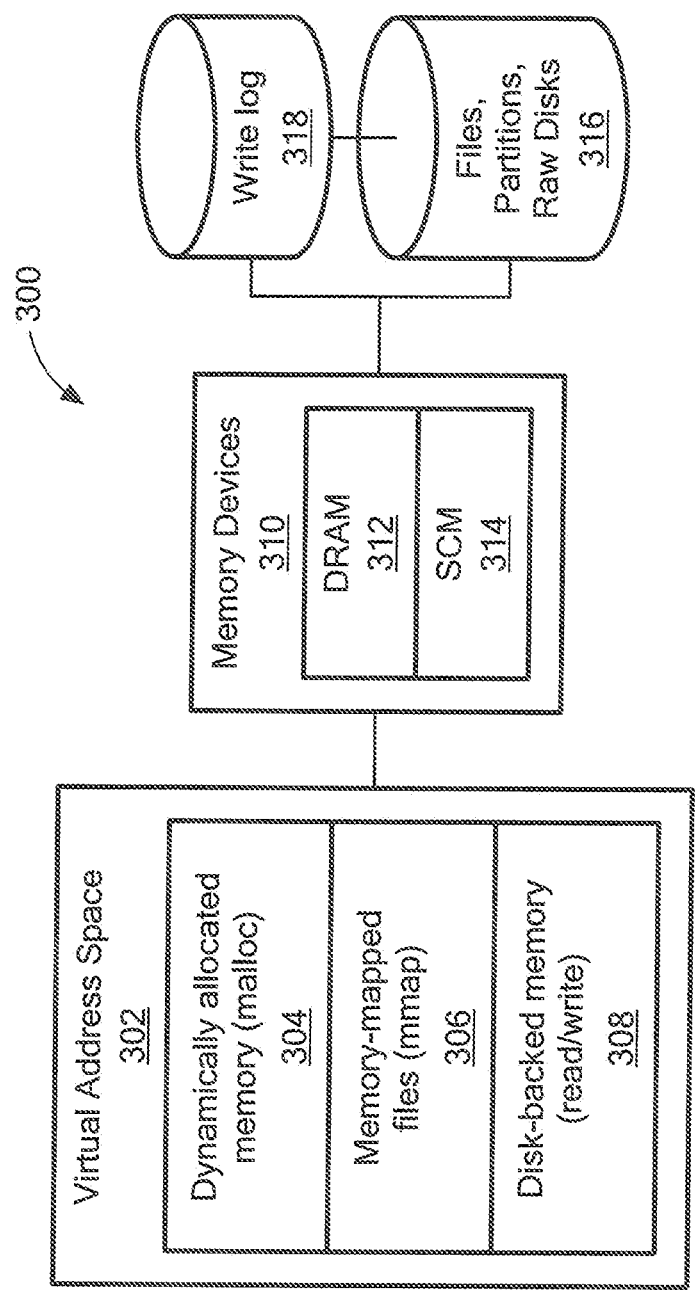
FIG. 3 is a block diagram illustrating a memory tiering layer.

FIG. 3 shows an illustrative memory tiering layer 300, which may be the same as or similar to memory tiering layer 228 of FIG. 2. As shown, the memory tiering layer 300 includes a virtual memory address space 302 comprising dynamically allocated memory 304, memory-mapped files 306, and disk-based memory 308. The virtual memory address space is backed by one or more physical memory devices 310, such as DRAM 312 and SCM 314. In embodiment, the memory tiering layer 300 further includes files, partitions and raw disks 316 and/or write logs 318.

In embodiments, the SCM 314 is exposed to an application as an "extended" tier of memory available for use that has performance characteristics that are different from the DRAM. Such performance characteristics can be taken into account when deciding what data to place into extended memory tiers. For example, some characteristics of extended memory tiers include, but are not limited to: SCM is directly accessible as memory; SCM significantly increases available capacity for all three memory allocation components, i.e., dynamically allocated memory (malloc), memory-mapped (mmap) files, and disk-backed memory; a page fault handler can still move (4 KB) pages in and out from storage for memory-mapped file pages; and a FileIO stack reads in pages for disk-backed memory, with writes being accomplished either synchronously or asynchronously.

The illustrative virtual memory address space 300 may correspond to the address space of a process executing on an application host (e.g., a host 102 in FIG. 1) or on a storage array (e.g., storage array 106 in FIG. 1). An application may access the SCM as memory-mapped files, such using the mmap system call known to those skilled in the art. Application developers are enabled to do this while still coding their systems using a memory based semantic. This allows, for example, the movement of data from traditional DRAM memory locations to SCM-backed memory locations.

By way of example, a storage tiering policy can be specified in a number ways, such as by an application partner via the specified on-boarding mechanism, which may be advantageous when the control point for information management is at the memory level. Also, a storage tiering policy can be specified by a storage administrator using a legacy storage tiering policy and management controls.

Before describing the above-mentioned on-boarding mechanisms, we describe below illustrative use cases (i.e., I/O data model and fully in-memory data model) for the data memory and storage tiering embodiments of the invention.

Figure 4:
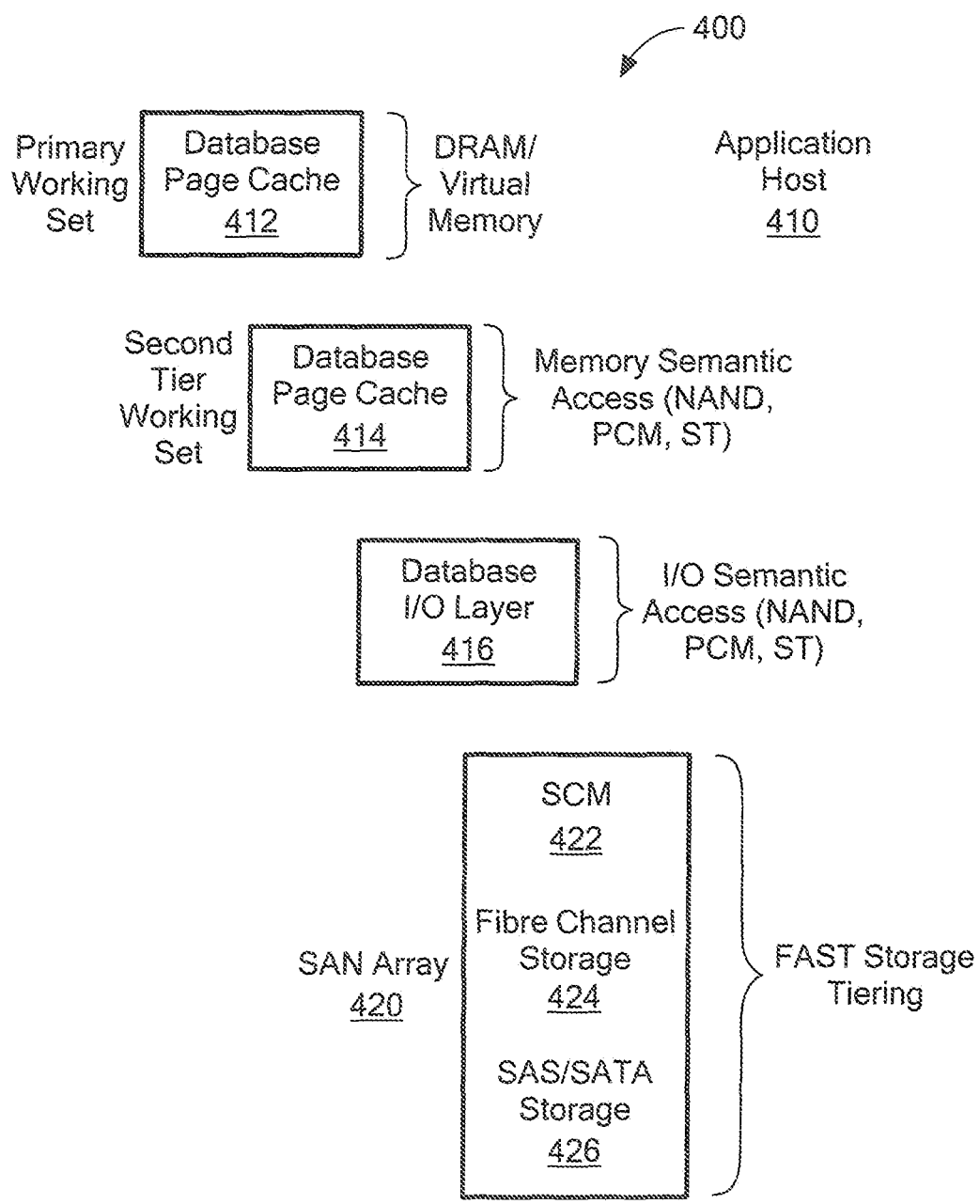
FIG. 4 shows a memory and storage tiering structure for an input/output data model according to an embodiment of the invention.

FIG. 4 shows a memory and storage tiering structure 400 for an input/output data model. As shown, application host 410 and SAN array 420 comprise a tier structure including a DRAM/virtual memory tier 412 (corresponding to tier 212 in FIG. 2), an SCM tier 414 accessible as memory (corresponding to tier 214), an SCM tier 416 accessible as I/O (corresponding to tier 216), an SCM tier 422 accessible as I/O (corresponding to SCM tier 222), a Fibre Channel storage tier 424 (corresponding to tier 224), and an SAS/SATA storage tier 426 (corresponding to tier 226).

A conventional approach to database applications is to utilize a buffered I/O data model. This is the model employed by many commercial database products. The buffered I/O data model assumes that memory, even virtual memory, is a limited resource relative to the amount of data in the working set of the database. In order to accommodate this limitation with a minimum impact to database workload performance, the most recently used database data (in chunks referred to here as pages) is retained and/or prefetched into a cache buffer (412) in the database host(s) virtual memory so that it can be utilized without expensive storage I/O access time. It is to be appreciated that there are many straightforward permutations to this basic buffered I/O data model approach.

It is quite advantageous for systems built on this buffered I/O model to have their entire working sets contained within those buffers. From a response time perspective, I/O is the most expensive operation, so the more that it can be avoided by extensive usage of buffer caches the better. Design inefficiencies exist in some database products where very large caches cannot be effectively utilized, but as a general principal, I/O avoidance is desirable.

Embodiments allow applications that employ a buffered I/O model to design for tiered buffer caches for expanding the amount of working set kept in buffer caches. Rather than simply utilizing a single large cache of database pages on the assumption that the access time to all data within a cache will be the same, an architecture is implemented such that rarely accessed, or purposely archived data can be put into a cache with slower access times. This cache (414) is backed by storage class memory with memory mapped files, rather than by traditional DRAM/virtual memory constructs (in 412). This memory tiering capability is particularly useful for applications which are tethered to the buffered I/O architecture, however, benefit from having immediate cached access to data which has aged-out and will only be accessed on important boundary conditions such as monthly batch cycle processing, or has been purposefully archived. Previously, such data could only be access via a completely I/O driven paradigm.

One limitation of the buffered I/O cache model and the full in-memory model, which will be discussed below, is persistence across a reboot of the application host(s). DRAM is volatile, meaning that any data that is placed into it is lost upon power failure or other restart events. Repopulation of the application cache is a major operation concern for all application vendors that rely on large DRAM-based caches. This is typically accounted for with a variety of business continuity techniques from page-level cache mirroring, through transaction replication redundancy across hosts. Embodiments can improve on these capabilities by offering the ability to have non-volatile caches. Storage class memory is a non-volatile resource, and when used to construct and utilize memory-mapped files to be consumed as application cache resource, the system now has the ability to have a non-volatile application cache that does not require expensive repopulation after a host outage. The customer may additionally be able to avoid complex and expensive replication schemes that are intended merely as a way to avoid extensive outage time after a failure.

This capability is useful when tiered memory and memory caches are used to house archived, aged-out, or rarely used data. A customer is not going to want to hold up the restart of production operations waiting for the repopulation of second tier information. It should be noted that this model is not the same as a statistically determined spillover tier (which will be discussed below in the context of FIG. 5). In this model, the customer/partner has determined that information residence in the tier corresponds to a business value that cannot be determined by statistics. For instance, if the data is considered archival, it belongs in the lower performing tier even if for some reason it is experiencing a spike in access. Alternatively, data from a "free" customer, as compared with a "paid" customer, may deserve a purposeful application tier distinction rather than a statistics based spillover.

Figure 5:
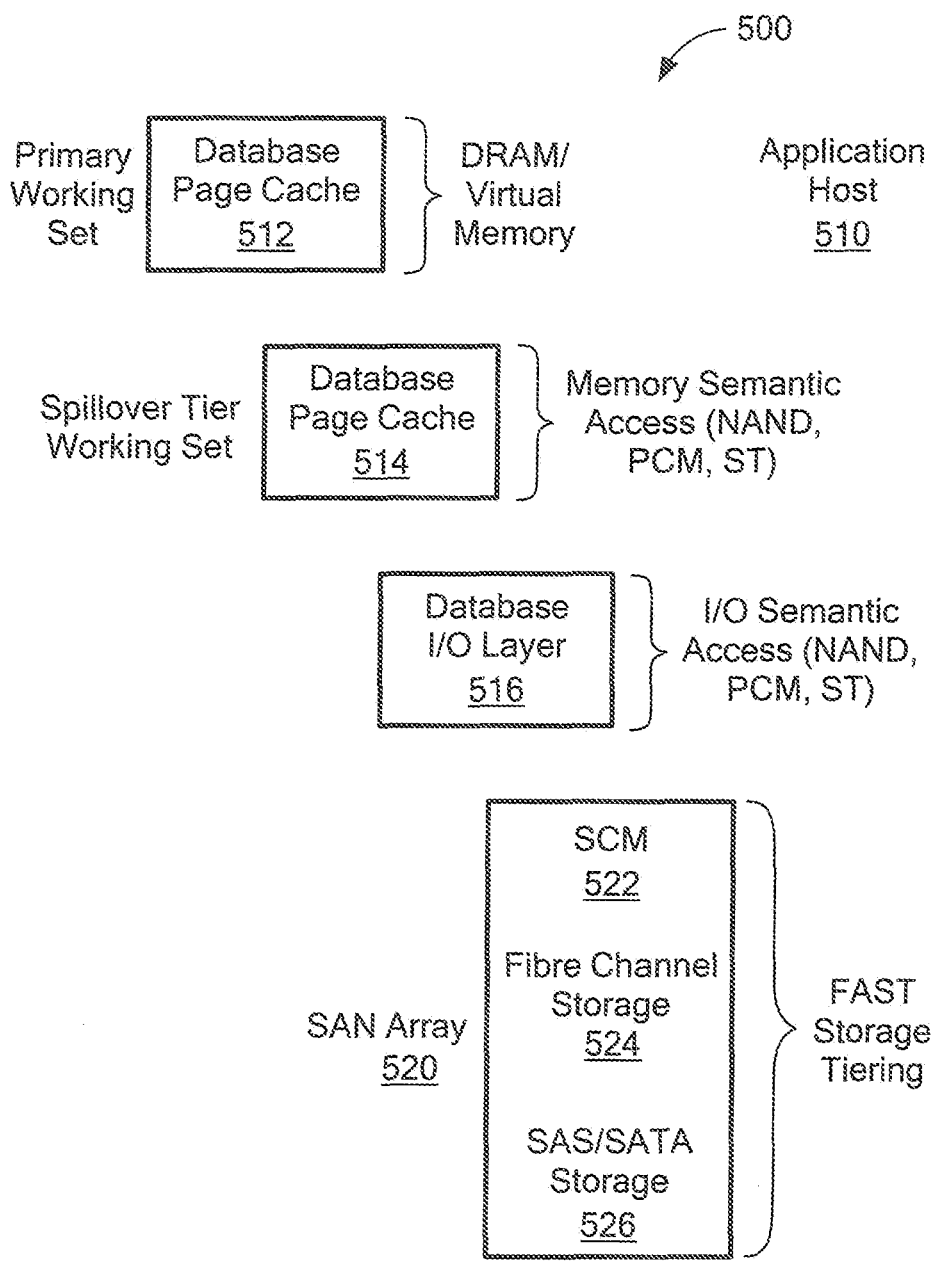
FIG. 5 shows a memory and storage tiering structure for an input/output data model with spillover tier according to an embodiment of the invention.

FIG. 5 shows a memory and storage tiering structure 500 for an input/output data model with spillover tier. As shown, application host 510 and SAN array 520 comprise a tier structure including a DRAM/virtual memory tier 512 (corresponding to tier 212 in FIG. 2), an SCM tier 514 accessible as memory (corresponding to tier 214), an SCM tier 516 accessible as I/O (corresponding to tier 216), an SCM tier 522 accessible as I/O (corresponding to SCM tier 222), a Fibre Channel storage tier 524 (corresponding to tier 224), and an SAS/SATA storage tier 526 (corresponding to tier 226).

As mentioned above, there is a spillover use case with respect to the buffered I/O data model. Based on some page aging criteria, the system can evict pages from the primary DRAM-backed page cache (512) and place the pages into an SCM flash-based cache (514) instead. Thus, embodiments enable a spillover capability that allows an application developer/vendor to take advantage of a persisted, replicated spillover that can be further tiered down into the traditional SAN storage layer (522, 524, and 526).

It is realized that the buffered I/O data model may have disadvantages for scalability. For example, there is an assumption that I/O is the primary mechanism for retrieval of information. As such, systems that utilize this approach may be inefficient for processing data in a full in-memory model, even when all data happens to be in the cache buffers and no actual I/O is required.

For this reason, a class of fully in-memory database products has been developed in the market. A fully in-memory database is one in which, during query operations, there is no facility to fetch data from external storage resources via an I/O mechanism. Data resides in virtual (or physical) memory, and is accessed with a memory semantic, or an error is produced by the database engine. These fully in-memory database engines today may still issue I/O in order to persist transaction changes to durable media. In essence, there is still both a memory model and an I/O model being employed, however, it is expected that the user is never waiting on application-generated I/O for the return of business critical information.

One of the design problems with these fully in-memory systems is scalability. Since the amount of memory that can be resident on a single host has a defined limit, these systems will either live within those limitations, or scale out by adding additional nodes in a clustered configuration, which can increase cost. When adding additional nodes, the customer is adding more than just memory. They are adding other expensive components within the cluster node as well, even though they may not have had a need for that resource or the power and space it consumes. Such systems may not be able to map the value of information to the cost of the resources they consume. For example, information resides in DRAM memory, which is a relatively expensive resource. Even when information is not used, or in an archive-worthy status, it must still reside in memory if it is to be utilized within the database model. Another issue is operational complexity. Adding nodes to existing production systems, and increasing the communication flow between nodes, simply to add data capacity, may be inefficient.

Embodiments allow database systems characterized as in-memory to utilize tiers of memory, storage class memory (SCM) accessed as memory mapped files, storage class memory (SCM) accessed as local storage, and the full palette of tiered SAN storage as part of their data access model, see, e.g., the tiering architectures of FIGS. 2 and 3. Database and application engineers are enabled to do this while still coding their systems using a memory based semantic. This allows for the usage of intelligent tiering rather than adding cluster nodes for many types of data expansion needs, including having full access to effectively limitless amounts of archival and aged-out data.

The approach to tiering at the storage layer can be characterized by: the creation of tiering policies by a storage administrator; and the automated movement of data between storage tiers based upon data collection and intelligent statistical processing applied in adherence to the desired policies. However, the approach to tiering at the host application/memory layer is somewhat different. At this layer of the application stack, the application administrator may determine the tiering policies. These may be fundamentally different from the goals, methods and implementation of a storage tiering policy.

For instance, a storage administrator may specify gold, silver, and bronze tiers of storage that correspond to I/O performance and replication attributes. The tiering of memory may more appropriately be set by an application administrator to indicate data attributes such as archive versus active, or other application-aware boundary conditions. But more specifically, the statistics about how data is used in memory within the application context is not directly available to the infrastructure provider. For these reasons, the decisions for placement of information into specific memory tiers lie with application providers.

Figure 6:
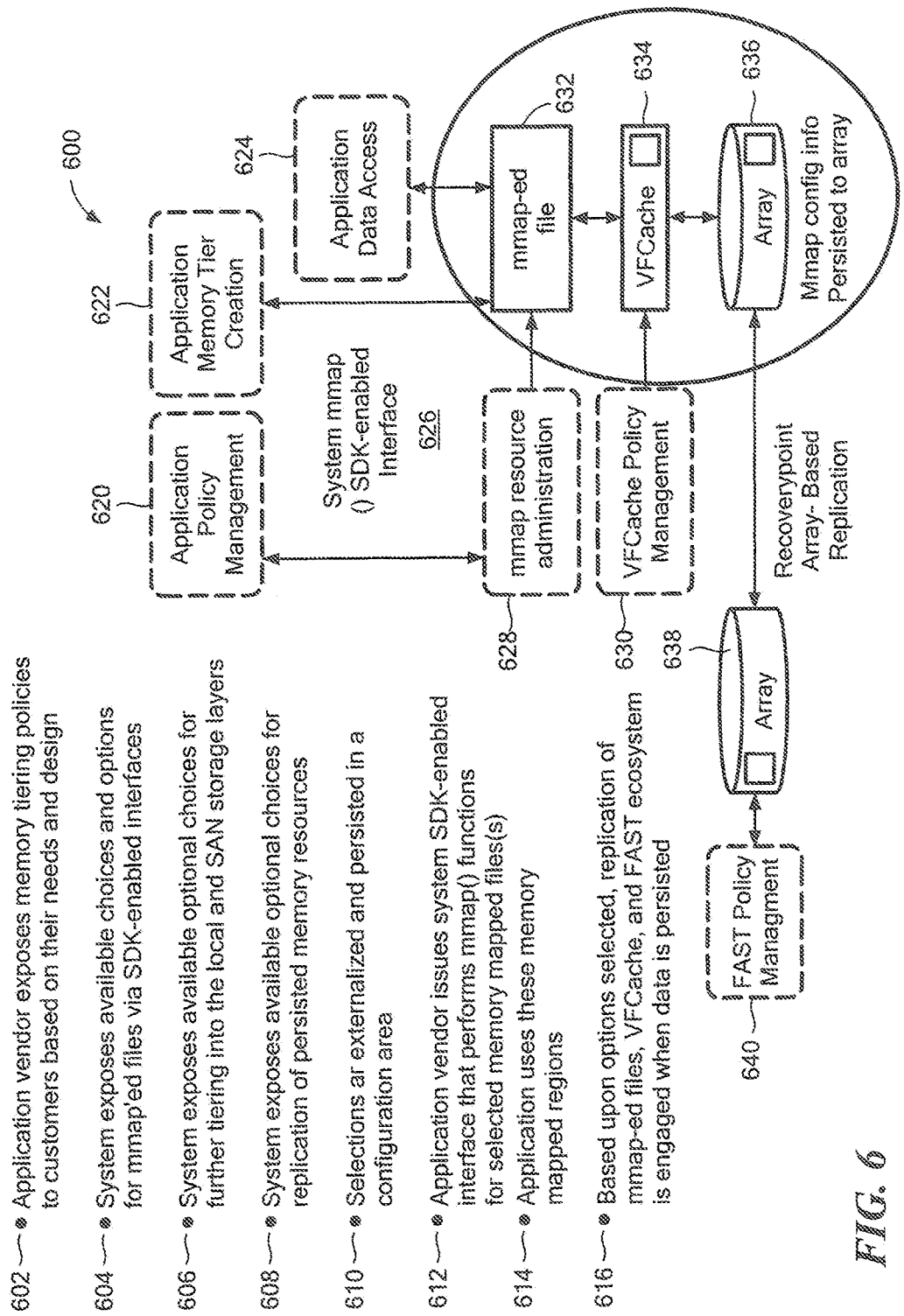
FIG. 6 shows a methodology for providing memory tiering control and functionality according to an embodiment of the invention.

FIG. 6 shows an illustrative methodology 600 for providing memory tiering control, e.g., an on-boarding methodology for tiering at the host application/memory layer (e.g., tiers 212 and 214 in FIG. 2). In conjunction with the on-boarding methodology 600, FIG. 6 illustrates components of the system (tiering architecture controlled by infrastructure provider) that are engaged during the on-boarding methodology. More specifically, as shown, the system includes a module 620 for application policy management, a module 622 for application memory tier creation, a module 624 for application data access, a memory mapped software development kit (SDK) enabled interface 626, a module 628 for memory mapped resource administration, a VFCache policy management module 630, memory mapped files 632, VFCache 634, array 636 (for persisting memory mapped configuration information), array 638 (for array-based replication), and a fully automated storage tiering (FAST) policy management module 640. It is to be appreciated that VFCache and its associated policies and FAST and its associated policies are technologies and/or products available from EMC Corporation of Hopkinton, Mass. However, embodiments are not limited to these specific cache or storage technologies.

In step 602, the application vendor exposes memory tiering policies to customers based on their needs and design. By the term "expose" as used herein, it is meant to enable or make available for selection. In step 604, the system exposes available choices and options for memory mapped files via one or more SDK-enabled interfaces (626). In step 606, the system exposes available optional choices for further tiering into the local and SAN storage layers. In step 608, the system exposes available optional choices for replication of persisted memory resources. In step 610, selections are externalized and persisted in a configuration area. In one embodiment, the configuration area is a persistent data store output from module 620, and is created by the application vendor. In step 612, the application vendor issues an SDK-enabled interface that performs mmap( ) functions for selected memory mapped files (632). In step 614, the application uses these memory mapped regions. In step 616, based upon options selected, replication of memory mapped files (632), VFCache (630), and the FAST (640) subsystem are engaged when data is persisted.

Embodiments also provide for the creation of other SDK tools that make it easier for application developers/vendors to utilize SCM-backed memory. For instance, SDK tools are configured to safely ease the movement of information from traditional DRAM memory locations to SCM-backed memory locations.

Figure 7:
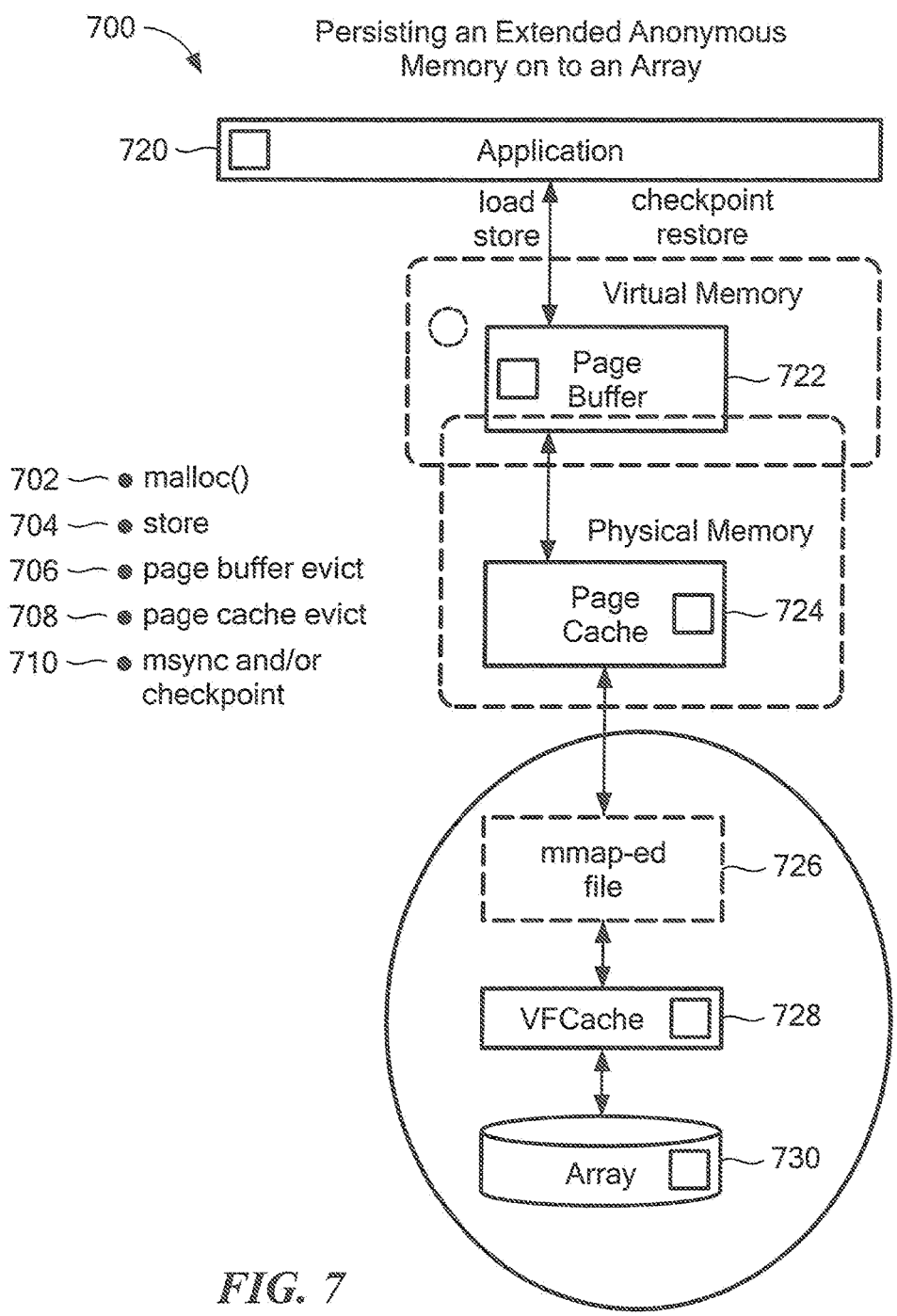
FIG. 7 shows a methodology for persisting extended anonymous memory to a storage array according to an embodiment of the invention.

We now turn to a description of persisting anonymous memory to multiple tiers of storage. FIG. 7 shows a methodology 700 for persisting extended anonymous memory to a storage array according to an embodiment of the invention. The methodology 700 will be described in the context of a system including an application 720, a page buffer (virtual memory) 722, a page cache (physical memory) 724, memory mapped files 726, VFCache 728, and array 730.

As shown, in order to persist anonymous memory to permanent storage, the following operating system processes are employed on the memory mapped files that are in use.

Step 702: malloc( )—this step allocates a number of bytes and returns a pointer to the allocated memory. This steps allocates a new amount of memory in the memory mapped file.

Step 704: store—load and store operations refer to how data in memory is made accessible for processing by a central processing unit (CPU). The store operation copies the values from a CPU's store data pipeline (or analogous architecture) to memory. Each CPU architecture has a different memory subsystem. The store operation is specified here to indicate this as part of the path for persisting anonymous memory out to the array.

Step 706: Page buffer evict—this step evicts a buffer of data out of virtual memory.

Step 708: Page cache evict—this step then evicts a page out of the physical page cache.

Step 710: msync and/or checkpoint—this step flushes all changes made to the memory mapped files (632) out to the VFCache (634) and thus to the underlying array (636).

Once employed, the above methodology ensures that changes made in memory to these structures will be persisted to the local storage under control of the host operating system. Furthermore, if the files are being serviced by a VFCache filter driver configuration, this data can/will also be persisted to other external arrays and device types, for example, pursuant to the designs of VFCache and FAST policies, as well as direct attached storage (DAS) policies.

Figure 8:
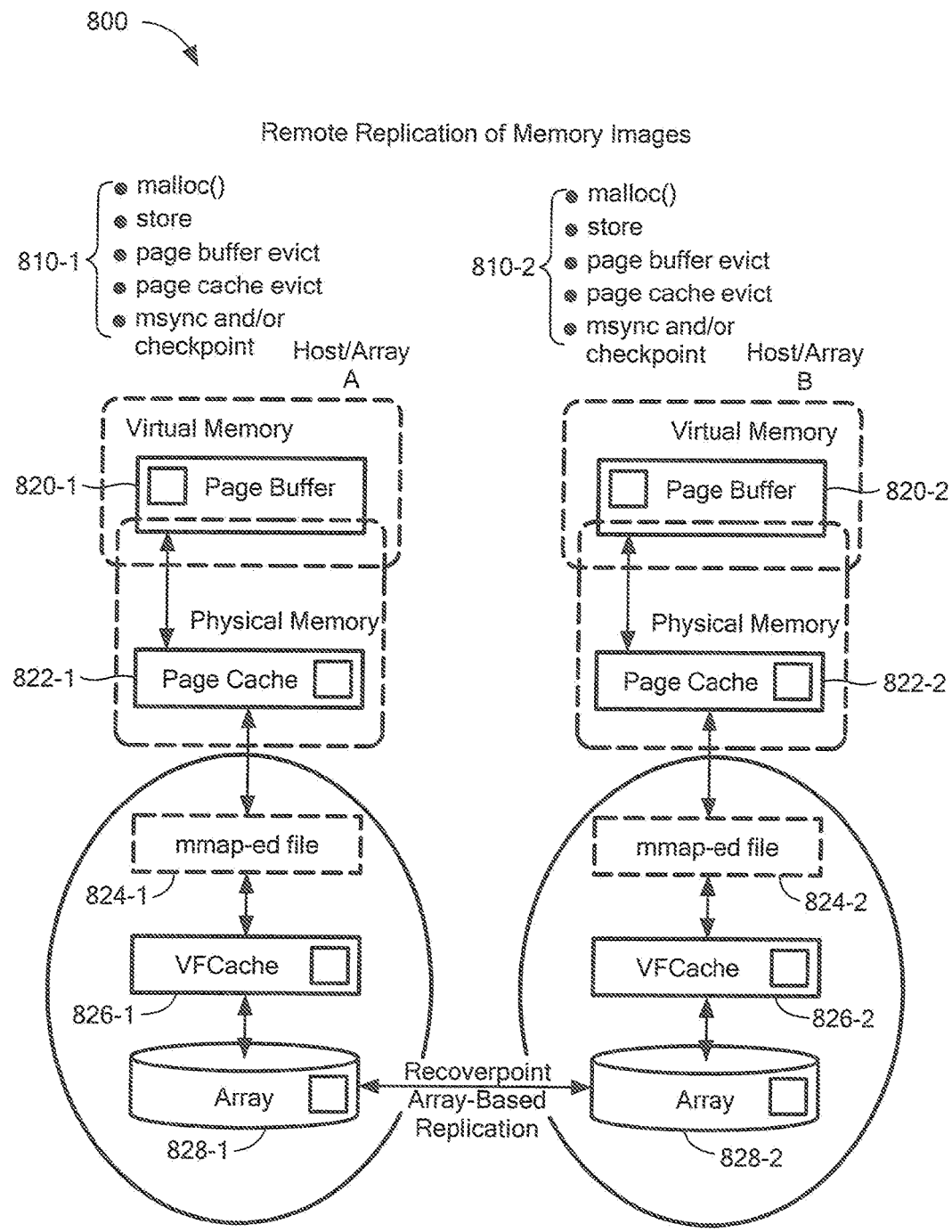
FIG. 8 shows a methodology for remote replication of memory images according to an embodiment of the invention.

We now turn to a description of remote replication/restore of memory images. FIG. 8 shows a methodology 800 for remote replication of memory images according to an embodiment of the invention. The methodology 800 will be described in the context of a system including page buffers (virtual memory) 820-1 and 820-2, page caches (physical memory) 822-1 and 822-2, memory mapped files 824-1 and 824-2, VFCaches 826-1 and 826-2, and arrays 828-1 and 828-2. Note that the -1 and -2 after each reference numeral identify either host/array set A (-1) or host/array set B (-2).

Since memory images are persisted as described above, they are eligible to be replicated by a replication product such as, by way of example only, Recoverpoint or Symmetrix Remote Data Facility, both commercially available from EMC Corporation of Hopkinton, Mass. As further described above, during the on-boarding process, replication options for persisted memory images can be chosen. The implementation of these options is transparent to the user via a programmatic interface with the underlying replication technology (Recoverpoint, SRDF, etc.). Recovery options can either be exposed through an on-boarding interface as well or through existing product recovery interfaces or both. FIG. 8 depicts a bi-directional replication of memory images, where each array contains the replicated image(s) generated from remote hosts.

As shown, a memory image is replicated from host/array set A to host/array set B (or vice versa). It is assumed that a given memory image is persisted to permanent storage using steps similar to those described above in FIG. 7. Thus, reference numerals 810-1 and 810-2 represent the same or similar steps as described above for reference numerals 702 through 710.

Figure 9:
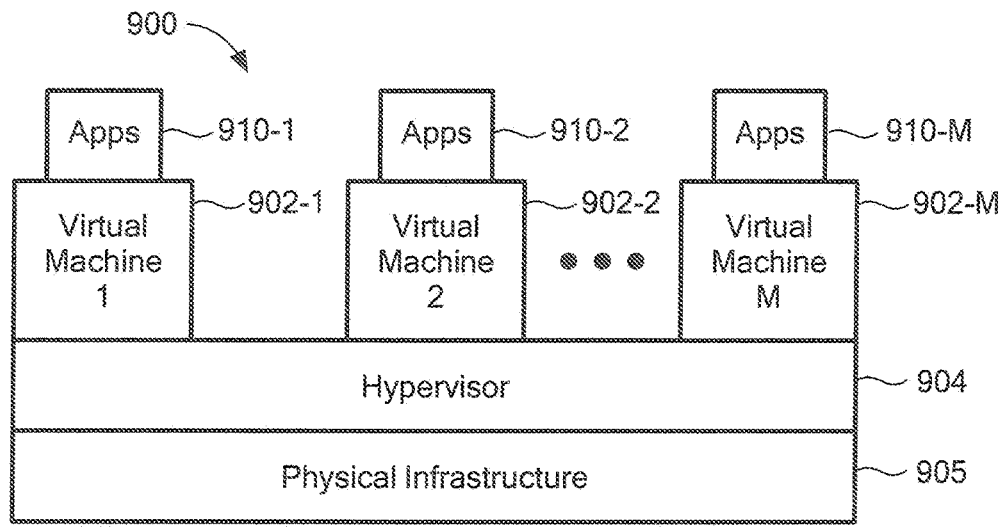
FIGS. 9 and 10 show examples of processing platforms utilized to implement a data memory and storage system environment.

It is to be appreciated that the various components and steps illustrated and described in FIGS. 1 through 8 can be implemented in a distributed virtual infrastructure or cloud infrastructure. FIG. 9 illustrates a cloud infrastructure 900. The data memory and storage environment 100 of FIG. 1 can be implemented, in whole or in part, by the cloud infrastructure 900.

As shown, the cloud infrastructure 900 comprises virtual machines (VMs) 902-1, 902-2, . . . , 902-M implemented using a hypervisor 904. The hypervisor 904 runs on physical infrastructure 905. The cloud infrastructure 900 further comprises sets of applications 910-1, 910-2, . . . , 910-M running on respective ones of the virtual machines 902-1, 902-2, . . . , 902-M (utilizing associated logical storage units or LUNs) under the control of the hypervisor 904.

As used herein, the term "cloud" refers to a collective computing infrastructure that implements a cloud computing paradigm. For example, as per the National Institute of Standards and Technology (NIST Special Publication No. 800-145), cloud computing is a model for enabling ubiquitous, convenient, on-demand network access to a shared pool of configurable computing resources (e.g., networks, servers, storage, applications, and services) that can be rapidly provisioned and released with minimal management effort or service provider interaction.

Although only a single hypervisor 904 is shown in the example of FIG. 9, a given embodiment of cloud infrastructure configured in accordance with an embodiment of the invention may include multiple hypervisors, each running on its own physical infrastructure. Portions of that physical infrastructure might be virtualized.

As is known, virtual machines are logical processing elements that may be instantiated on one or more physical processing elements (e.g., servers, computers, or other processing devices). That is, a "virtual machine" generally refers to a software implementation of a machine (i.e., a computer) that executes programs in a manner similar to that of a physical machine. Thus, different virtual machines can run different operating systems and multiple applications on the same physical computer. Virtualization is implemented by the hypervisor 904 which, as shown in FIG. 9, is directly inserted on top of the computer hardware in order to allocate hardware resources of the physical computer (physical infrastructure 905) dynamically and transparently. The hypervisor 904 affords the ability for multiple operating systems to run concurrently on a single physical computer and share hardware resources with each other.

An example of a commercially available hypervisor platform that may be used to implement portions of the cloud infrastructure 900 in one or more embodiments of the invention is vSphere which may have an associated virtual infrastructure management system such as vCenter, both commercially available from VMware Inc. of Palo Alto, Calif. The underlying physical infrastructure 905 may comprise one or more distributed processing platforms that include storage products such as VNX and Symmetrix VMAX, both commercially available from EMC Corporation of Hopkinton, Mass. A variety of other storage products may be utilized to implement at least a portion of the cloud infrastructure 900.

Figure 10:
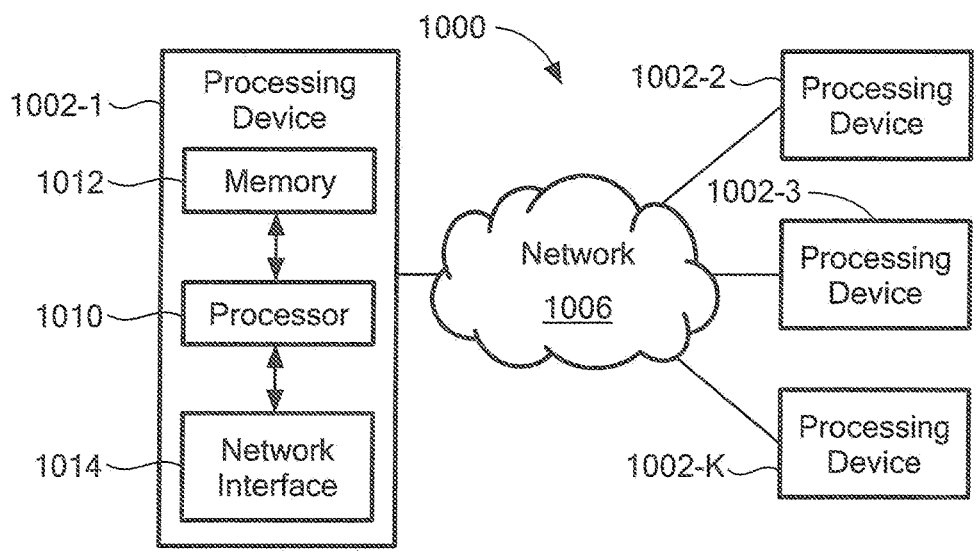

An example of a processing platform on which the cloud infrastructure 900 may be implemented is processing platform 1000 shown in FIG. 10. The processing platform 1000 in this embodiment comprises a plurality of processing devices denoted 1002-1, 1002-2, 1002-3, . . . , 1002-K which communicate with one another over a network 1006. One or more of the components shown and described in FIGS. 1 through 8 may therefore each run on one or more storage arrays, one or more hosts, servers, computers or other processing platform elements, each of which may be viewed as an example of what is more generally referred to herein as a "processing device." As illustrated in FIG. 10, such a device generally comprises at least one processor and an associated memory, and implements one or more functional modules for controlling certain features of components shown in FIGS. 1 through 8. Again, multiple elements or modules may be implemented by a single processing device in a given embodiment.

The processing device 1002-1 in the processing platform 1000 comprises a processor 1010 coupled to a memory 1012. The processor 1010 may comprise a microprocessor, a microcontroller, an application-specific integrated circuit (ASIC), a field programmable gate array (FPGA) or other type of processing circuitry, as well as portions or combinations of such circuitry elements. The memory 1012, specifically shown in FIG. 10, may be viewed as an example of what is more generally referred to herein as a "computer program product." A computer program product comprises a processor-readable storage medium having encoded therein executable code of one or more software programs. Such a memory may comprise electronic memory such as random access memory (RAM), read-only memory (ROM) or other types of memory, in any combination. The computer program code when executed by a processing device such as the processing device 1002-1 causes the device to perform functions associated with one or more of the components shown in FIGS. 1 through 8. One skilled in the art would be readily able to implement such software given the teachings provided herein. Other examples of computer program products embodying embodiments of the invention may include, for example, optical or magnetic disks.

Also included in the processing device 1002-1 is network interface circuitry 1014, which is used to interface the processing device with the network 1006 and other system components. Such circuitry may comprise conventional transceivers of a type well known in the art. The other processing devices 1002 of the processing platform 1000 are assumed to be configured in a manner similar to that shown for processing device 1002-1 in the figure.

The processing platform 1000 shown in FIG. 10 may comprise additional known components such as batch processing systems, parallel processing systems, physical machines, virtual machines, virtual switches, storage volumes, logical units, etc. Again, the particular processing platform shown in FIG. 10 is presented by way of example only, and components and steps shown and described in FIGS. 1 through 8 may include additional or alternative processing platforms, as well as numerous distinct processing platforms in any combination.

Also, numerous other arrangements of servers, computers, storage devices or other components are possible for implementing components shown and described in FIGS. 1 through 8. Such components can communicate with other components over any type of network, such as a wide area network (WAN), a local area network (LAN), a satellite network, a telephone or cable network, a storage network (e.g., Fibre Channel, iSCSI, Ethernet), a converged network (e.g., FCoE or Infiniband) or various portions or combinations of these and other types of networks.

Figure 11:
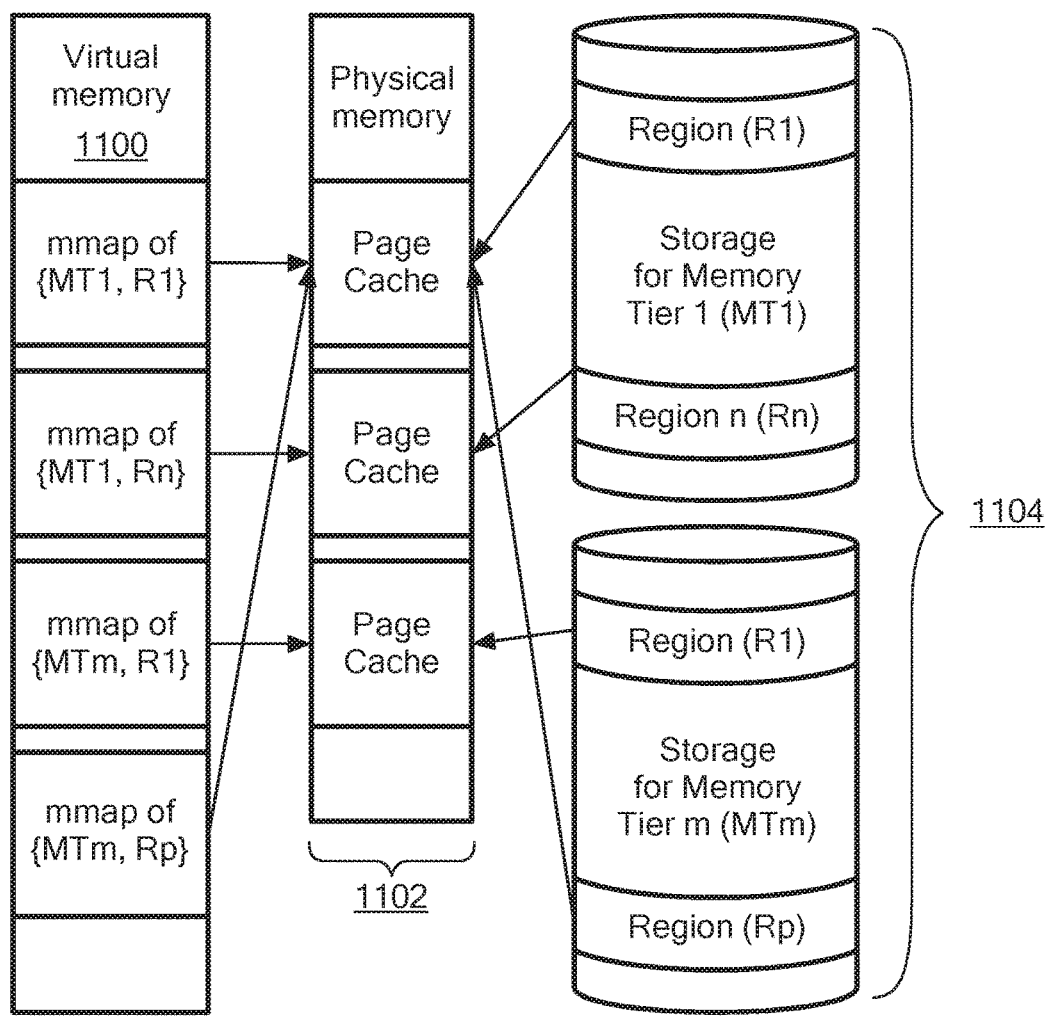
FIG. 11 is a schematic representation of multiple mmaps and multiple page caches for tiered memory.

FIG. 11 shows a schematic representation of a virtual memory 1100 having page caches 1102 for tiered memory 1104. In the illustrated embodiment, a first memory tier MT1 has a number of regions R1-N and a Mth memory tier MTm has number of regions R1-P. The page caches 1102 are provided in physical memory where each page cache can be shared with multiple regions in tiered memory. One or more processes can create mmaps for regions in the tiered memory and associate them with one or more of the page caches 1102. In one embodiment, the page caches are dynamically configurable in size.

In a data storage environment comprised of combined memory tiering and storage tiering, the ability to create multiple, independent memory tiers is desirable. In one embodiment, the memory tiers MT1-$m$ are constructed by memory mapping a region of a storage class memory (SCM) device or a region of an array storage device into virtual address space for a process.

Each memory mapped region in tiered memory 1104 is fronted by a DRAM page cache 1102 to which an application issues loads and stores. The memory management mechanism moves data between the SCM or array device and the DRAM page cache on an on-demand page basis.

In general, there can be multiple memory tiers and multiple DRAM page caches. Each memory tier may have its own DRAM page cache or may be arranged in groups where each group of memory tiers has its own DRAM page cache. The DRAM page caches are sized and managed independently from each other allowing for differing quality of services and isolation between multiple tenants.

In another aspect of the invention, an application manages a cache replacement policy by setting a color hint to a page or range of pages. A physically indexed CPU cache operates so that addresses in adjacent physical memory blocks are in different positions or cache lines. For virtual memory, when virtually adjacent but not physically adjacent memory blocks are allocated, the same position in the cache could be taken. So-called cache coloring is a memory management technique that selects pages so that there is no contention with neighboring pages.

Free pages that are contiguous from a CPU perspective are allocated in order to maximize the total number of pages cached by the processor. When allocating sequential pages in virtual memory for processes, the kernel collects pages with different "colors" and maps them to the virtual memory.

A cache replacement policy refers to the way existing cache entries are replaced with new entries. For a cache miss, the cache may have to evict one of the existing entries. It is desired to evict the existing cache entry that is least likely to be used in the future. For example, one known replacement policy is the least-recently used (LRU) policy that replaces the least recently accessed entry.

Figure 12:
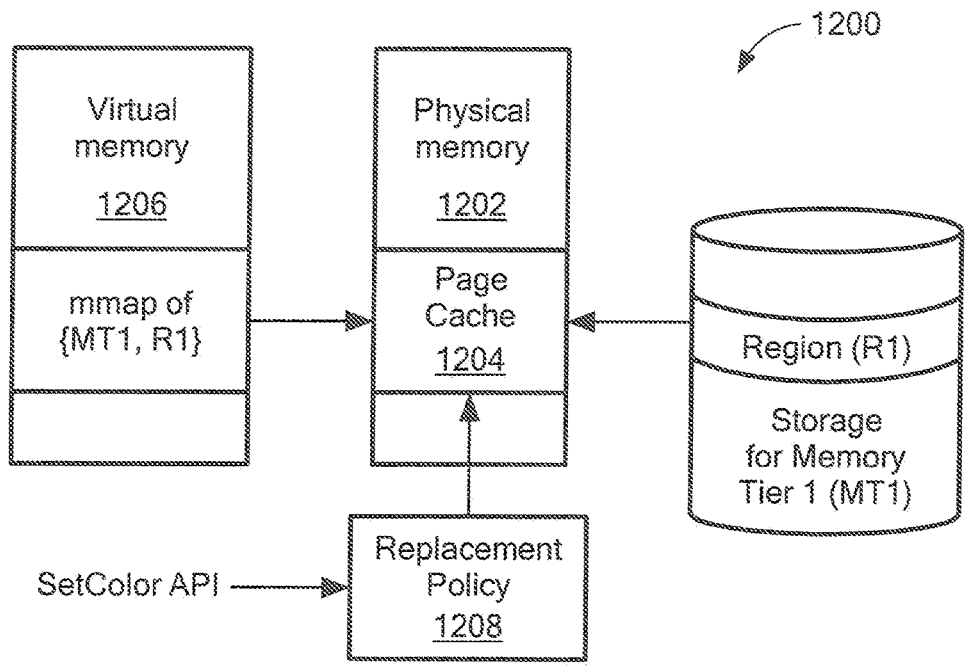
FIG. 12 is a schematic representation of memory tier page cache with coloring hints.

FIG. 12 shows an illustrative tiered memory scheme 1200 with page cache coloring hints. Physical memory 1202 includes a page cache 1204 for a first region R1 of tiered memory MT1. Virtual memory 1206 includes a mmap {MT1, R1} for the tiered memory region R1. An application can manage a cache replacement policy 1208 by setting a color hint to a page or range of pages. A higher color hint means the page(s) are 'hotter' so that the page should not be evicted over a page that is 'colder,' e.g., has a lower color value.

It is understood that a 'hotter' page is defined as a page which is either accessed more frequently than another (colder') page or that the importance of the data within the page is such that the access cost should be minimized in terms of latency and/or throughput regardless of access frequency.

The memory management mechanism moves data between the SCM or array device and the DRAM page cache 1204 on an on-demand page basis. The application can specify the importance of ranges of addresses within the memory tier MT1 by communicating a page color. The various page color values are in turn used to modify the eviction mechanism managing the page cache 1204 replacement policy 1208. For example, pages colored with an 'important' color would be moved earlier in an LRU list where pages colored with a less 'important' color value would be moved further down in an LRU list. This allows the application to describe ranges that need not be kept in cache while favoring ranges that should be kept in cache.

Figure 12A:
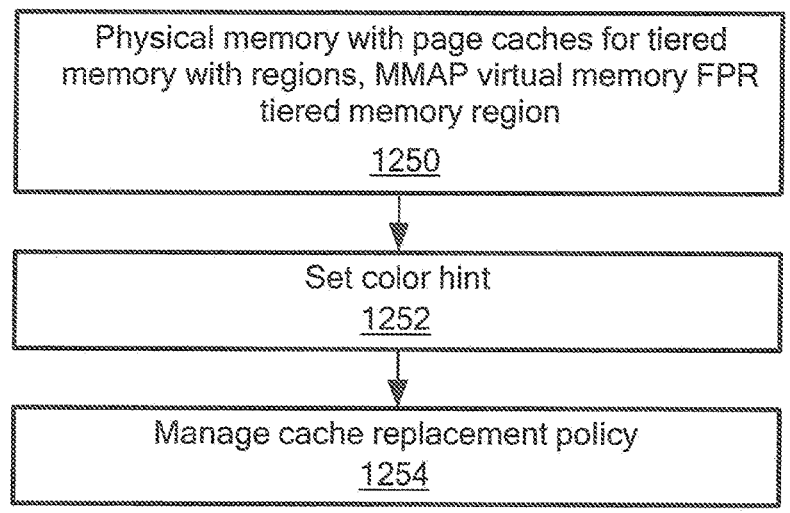
FIG. 12A is a flow diagram showing an illustrative sequence of steps for page cache with coloring hints.

FIG. 12A shows an illustrative sequence of steps for providing a cache replacement policy. In step 1250, physical memory has a first memory tier having regions and virtual memory has mmaps of regions in the first memory tier. In step 1252, implementing a cache replacement policy includes setting a color hint to a first one of the page caches, wherein the color hint includes a value indicating hotness of the first one of the page caches. In step 1254, the cache replacement policy is managed, such as by evicting a first one of the page caches over a second one of the page caches having a higher hotness value than the first one of the page caches.

Individual regions 1302 can be block aligned and granular to a unique block size if desired. In one embodiment, the minimum block size is 4K and there is no maximum limit. Each region 1302 is named with a NULL terminated string so retrieval and management of regions is name based. If a region table becomes too fragmented, regions can be moved automatically (defragmentation) on the block device to create more free linear space. A user region is a linear block of storage on the block device 1300. A user region can become a separate block device, or used directly by applications.

It is understood that regions 1302 are similar to disk partitions. A minimum block size of 4096 corresponds to the typical native block size for non-volatile based flash storage devices. Larger block sizes can be used if desired. Regions can be created, deleted, and defragmented dynamically using the region utility.

Figure 13A:
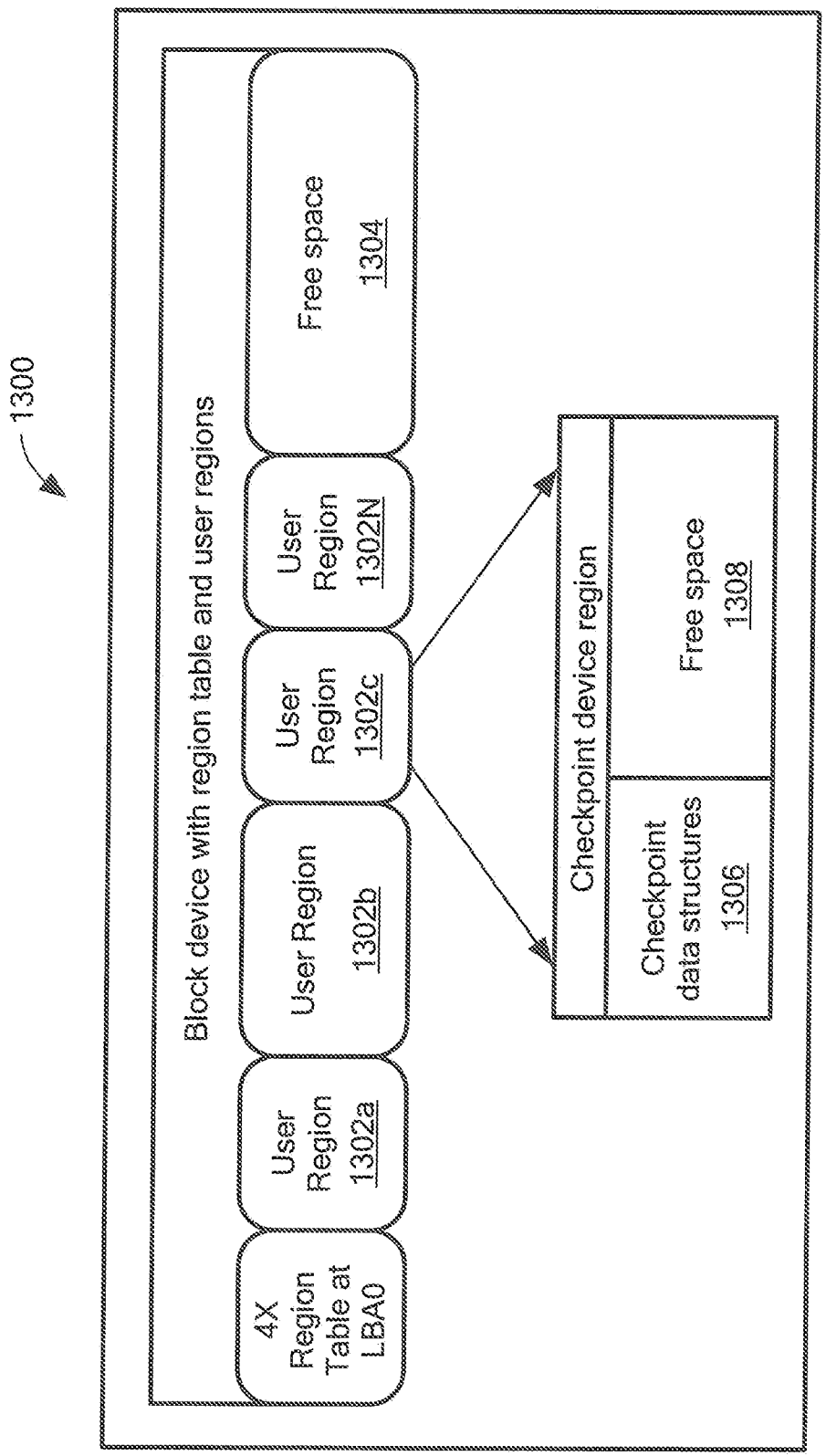
FIG. 13A is a functional block diagram of region utility to manage regions on a block device and FIG. 13B is an architecture diagram of a region table and regions on a block device.
Figure 13B:
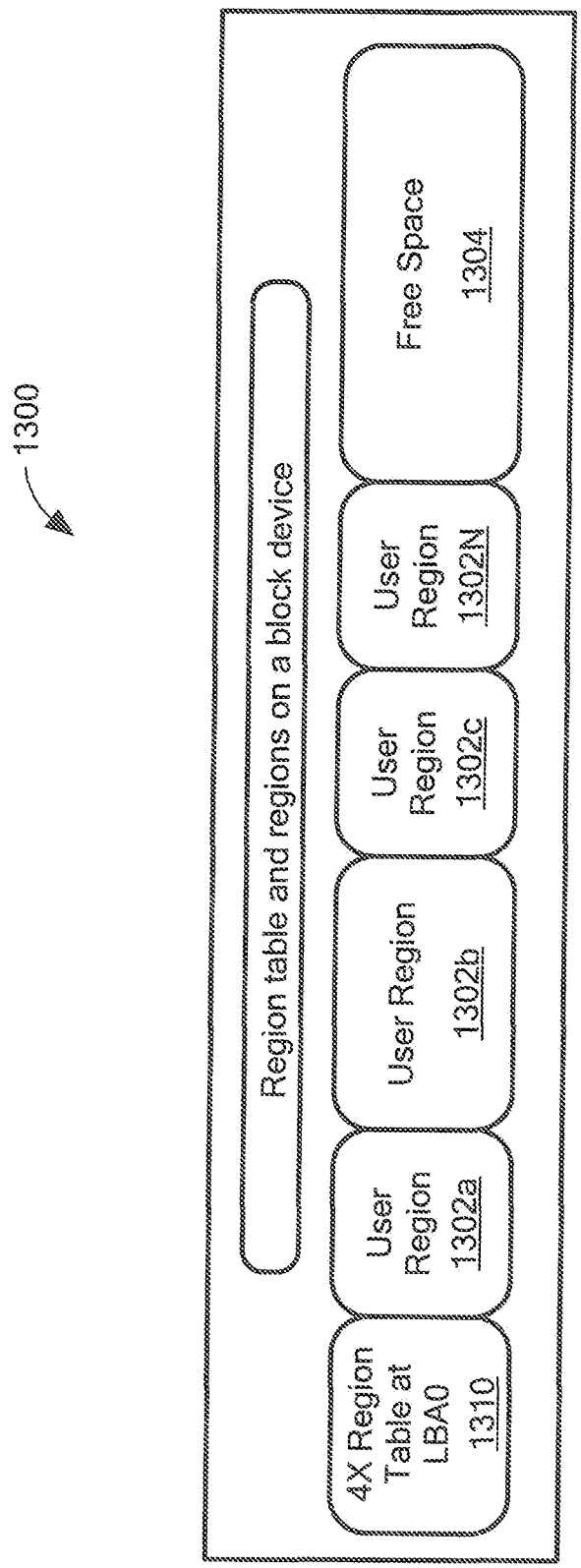

As shown in FIG. 13B, a region table structure 1310 is located at physical LBA 0 on the block device 1300. The region table 1310 occupies one or more 4K blocks. In one embodiment, each region table block provides fourteen regions. Additional region table blocks are automatically allocated and linked together to provide support for an unlimited number of user regions. An illustrative code listing below shows one embodiment of a table structure.

```
#define MAX_REGIONS 14        // Maximum of 14 regions per region table block.
typedef struct XSW_REGION_TABLE_T { __attribute__((packed))
        u64 region_head_sig;                            // 0xAA55A5A555AA5A5A
        u64 disk_size;                                  // Size of block device
        XSW_BLOCK_REGION region[MAX_REGIONS];           // 14 regions per table
        int number_regions;                             // Number of active regions
        u32 blksize;                                    // Default block size
        u64 region_tail_sig;                            // 0x55AA5A5AAA55A5A5
        u64 current_lba;                                // Location of this table
        u64 next_lba;                                   // Location of next block
        u32 crc32;                                      // CRC32 of region table
} XSW_REGION_TABLE;
```

FIG. 13A shows a block device 1300 with user regions 1302a-n and free space 1304. Each user region 1302c has a checkpoint data structure 1306 and free space 1308. Management functions for constructing multiple named regions within an SCM device or an array storage device are provided, where the regions 1302 are used as a container for The block region structure defines the region. For example, a region has an offset in bytes from the beginning of the physical device, a size in bytes of the region, a block size for the region, a null terminated region name, region flags, and a region state. An illustrative code listing below shows one embodiment of a block region structure.

```
#define MAX_REGION_NAME 255
typedef struct XSW_BLOCK_REGION_T { __attribute__((packed))
        u64     offset;                      // Region offset in bytes.
        u64     size;                        // Region size in bytes.
        u32     blksize;                     // Region Block size in bytes.
        u32     flags;                       // See region flags below
        u8      state;                       // See region states below.
        char    name [MAX_REGION_NAME+1];    // NULL terminated region name.
} XSW_BLOCK_REGION
``` a particular memory tier. The region utility can create, delete, defrag, zero, etc. In addition, the utility allows the setting and clearing of per-region flags which indicate and control functions applied to the region.

The region utility provides the ability to manage regions on the block device 1300. It is understood that a region 1302 is a block-aligned region similar to a disk partition. In illustrative embodiments, there is support for an unlimited number of regions on a single block device.

In one embodiment, each region has a state. Illustrative states are described below.
REGION_STATE_FREE
   This region is free space on the device.
REGION_STATE_ALLOCATED
   This region is allocated and named.
REGION_STATE_EXT
   This region is internal and used to expand the region table.

In embodiments, each region has a set of flags. Illustrative flags are described below.

REGION_FLAGS_UNMOVABE

When this flag is set, this region will never be physically moved on the block device when defragmentation occurs.

REGION_FLAGS_DIRTY

This flag is available to mark that a region has been written to. Applications can set/clear the region flag to indicate that they have written or initialized data in the region.

Figure 14:
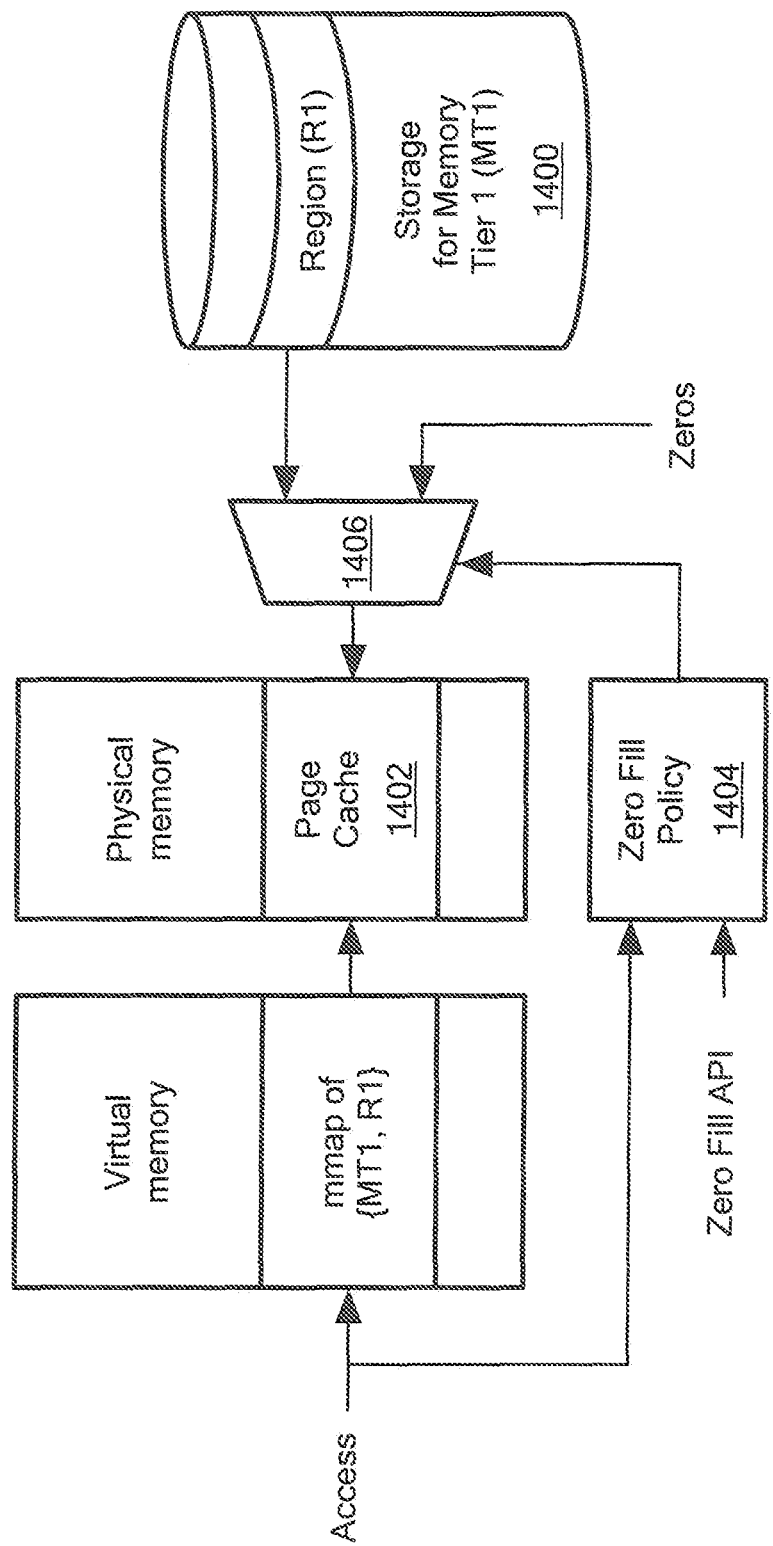
FIG. 14 is a schematic representation of tiered memory having region zero fill on-demand.

FIG. 14 shows a region zero-fill on demand for tiered memory. In the illustrated embodiment, tiered memory 1400 has a first region R1 in a first memory tier MT1 having a page cache 1402 in physical memory. Virtual memory includes a mmap {MT1, R1} of the first region R1. A zero fill policy 1404 controls a multiplexer 1406 to which zeroes and the first region R1 are input. The output of the multiplexer 1406 is coupled to the page cache 1402.

In an illustrative embodiment, a per-region attribute is provided which when set on the first access to the page cache 1402 within the memory mapped region R1, suppresses data transfer from the SCM or array storage 1400 and provides a zeroed page. This eliminates an additional data transfer.

When an access modifies a portion of a mmaped page, the page is first paged into the page cache. In the event the modifying access is the first access to ever touch a particular page, there is no need to page-in the uninitialized page from the region but instead provide a page of zeros instead.

Figure 15:
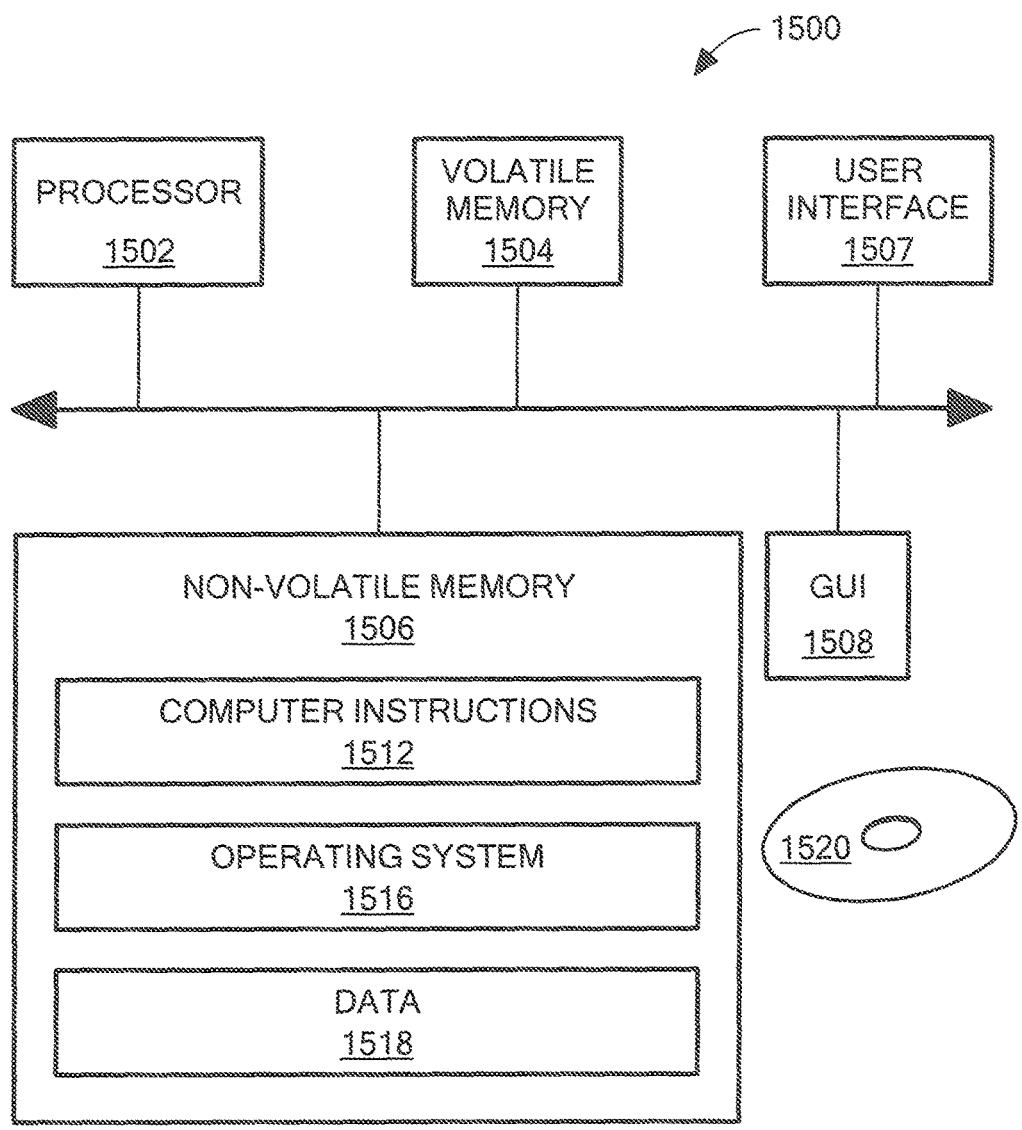
FIG. 15 is a schematic representation of a computer that can perform at least a portion of the processing described herein.

FIG. 15 shows an exemplary computer 1500 that can perform at least part of the processing described herein. The computer 1500 includes a processor 1502, a volatile memory 1504, a non-volatile memory 1506 (e.g., hard disk), an output device 1507 and a graphical user interface (GUI) 1508 (e.g., a mouse, a keyboard, a display, for example). The non-volatile memory 1506 stores computer instructions 1512, an operating system 1516 and data 1518. In one example, the computer instructions 1512 are executed by the processor 1502 out of volatile memory 1504. In one embodiment, an article 1520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:

providing zero-fill on demand for tiered memory including a first region in a first memory tier having a page cache in physical memory, wherein virtual memory includes a mmap of the first region, wherein the mmap for the first region is mapped to the virtual memory for a process, and wherein the tiered memory includes a second region that shares the page cache with the first region;

controlling an input between zeroes and the first region to the page cache; and providing an attribute for the first region which when set on the first access to the page cache suppresses data transfer from the tiered memory to enable the zero-fill of the page cache.

2. The method according to claim 1, further including providing a multiplexer having an output coupled to the page cache and input coupled to the first region and a zero fill module.

3. The method according to claim 1, further including controlling a per region attribute to selectively suppress data transfer from the storage to the page cache.

4. The method according to claim 1, wherein the physical memory comprises SCM storage.

5. The method according to claim 1, wherein the page cache comprises DRAM memory.

6. An article, comprising:

a non-volatile computer-readable storage medium having stored instructions that enable a machine to:

provide region zero-fill on demand for tiered memory including a first region in a first memory tier having a page cache in physical memory, where virtual memory includes a mmap of the first region, wherein the mmap for the first region is mapped to the virtual memory for a process, and wherein the tiered memory includes a second region that shares the page cache with the first region;

control an input between zeroes and the first region to the page cache; and control an attribute for the first region which when set on the first access to the page cache suppresses data transfer from the tiered memory to enable the zero-fill of the page cache.

7. The article according to claim 6, further including instructions to control a multiplexer having an output coupled to the page cache and input coupled to the first region and a zero fill module.

8. The article according to claim 6, further including instructions to control a per region attribute to selectively suppress data transfer from the storage to the page cache.

9. The article according to claim 6, wherein the physical memory comprises SCM storage.

10. The article according to claim 6, wherein the page cache comprises DRAM memory.

11. A system, comprising:
a memory; and
a processor coupled to the memory, the processor and the memory configured to:
provide region zero-fill on demand for tiered memory including a first region in a first memory tier having a page cache in physical memory, wherein virtual memory includes a mmap of the first region, wherein the mmap for the first region is mapped to the virtual memory for a process, and wherein the tiered memory includes a second region that shares the page cache with the first region;
control an input between zeroes and the first region to the page cache; and
control an attribute for the first region which when set on the first access to the page cache suppresses data transfer from the tiered memory to enable the zero-fill of the page cache.

12. The system according to claim 11, wherein the processor and the memory are further configured to control a multiplexer having an output coupled to the page cache and input coupled to the first region and a zero fill module.

13. The system according to claim 11, wherein the processor and the memory are further configured to control a per region attribute to selectively suppress data transfer from the storage to the page cache.

14. The system according to claim 11, wherein the physical memory comprises SCM storage.

15. The system according to claim 11, wherein the page cache comprises DRAM memory.

* * * * *